United States Patent
Scobey et al.

(10) Patent No.: US 6,736,943 B1
(45) Date of Patent: May 18, 2004

(54) APPARATUS AND METHOD FOR VACUUM COATING DEPOSITION

(75) Inventors: Michael A. Scobey, Santa Rosa, CA (US); David L. Soberanis, Hopland, CA (US); Daniel V. Whitlock, Healdsburg, CA (US); Thomas L. Greenberg, Berkeley, CA (US); Elizabeth M. Wescott, Santa Rosa, CA (US); William P. Kastanis, Windsor, CA (US)

(73) Assignee: Cierra Photonics, Inc., Santa Rosa, CA (US)

( * ) Notice: Subject to any disclaimer, the term of this patent is extended or adjusted under 35 U.S.C. 154(b) by 0 days.

(21) Appl. No.: 10/095,828

(22) Filed: Mar. 12, 2002

Related U.S. Application Data
(60) Provisional application No. 60/275,939, filed on Mar. 15, 2001.

(51) Int. Cl.[7] .............................................. C23C 14/34
(52) U.S. Cl. ........................... 204/192.12; 204/298.02; 204/298.03; 204/298.23; 204/298.28
(58) Field of Search ....................... 204/192.12, 298.02, 204/298.03, 298.09, 298.15, 298.16, 298.17, 298.23, 298.28

(56) References Cited

U.S. PATENT DOCUMENTS

| | | | | |
|---|---|---|---|---|
| 5,464,518 A | * | 11/1995 | Sieck et al. ............ | 204/192.12 |
| 5,616,225 A | * | 4/1997 | Sieck et al. ............ | 204/298.14 |
| 5,858,180 A | * | 1/1999 | Hsu ....................... | 204/192.12 |
| 5,911,856 A | * | 6/1999 | Suzuki et al. .......... | 204/192.13 |
| 6,416,635 B1 | * | 7/2002 | Hurwitt et al. ........ | 204/192.13 |
| 6,419,802 B1 | * | 7/2002 | Baldwin et al. ....... | 204/192.13 |
| 2002/0029959 A1 | * | 3/2002 | Yo et al. ................ | 204/192.12 |

* cited by examiner

Primary Examiner—Steven Versteeg
(74) Attorney, Agent, or Firm—Banner & Witcoff, Ltd.

(57) ABSTRACT

Vacuum coating deposition apparatus and methods employ a vacuum chamber with a superstructure to which deposition components in the vacuum chamber are mounted, such as a sputter target, substrate, etc. to provide a fixed relative position between them substantially unaffected by environmental and operating vibrations and flexure of the chamber wall. The superstructure is structurally independent of the deposition chamber wall and may be housed within the chamber or externally, extending from an external position to or through the wall of the deposition chamber. A meter of sensor, e.g., an optical monitor for measuring film thickness during deposition, continually monitors at least one parameter of the coating deposition and generates a corresponding control signal. A controller responsive to the control signal continually controls at least one process variable of the coating deposition in response to the control signal.

69 Claims, 12 Drawing Sheets

APPARATUS AND METHOD FOR VACUUM COATING DEPOSITION

PRIORITY APPLICATION

This application claims the benefit of U.S. Provisional Application No. 60/275,939 filed Mar. 15, 2001 and titled "Apparatus and Method for Vacuum Coating Deposition.

CROSS-REFERENCED APPLICATIONS

This application is related to commonly assigned U.S. Provisional Application No. 60/276,316 filed on Mar. 16, 2001 and titled "Optical Monitoring of Thin Film Deposition Thickness," the entire disclosure of which is hereby incorporated herein by reference for all purposes.

INTRODUCTION

This invention relates to physical vapor deposition (PVD) apparatus and methods and, more particularly relates to improved vacuum coating apparatus and methods suitable for producing high precision thin film coatings on substrates.

BACKGROUND

Vacuum coating techniques are known and used in the production of coated substrates for numerous applications including, for example, thin film optical devices, such as optical substrates having reflective, anti-reflective, wavelength selective or other thin film coatings to perform as filters, mirrors, interleavers, wide band pass filters, narrow band pass filters, edge filters, short wave pass filters, long wave pass filters and other devices useful in optical communication systems, sensors and other applications.

Physical vapor deposition (PVD) of thin films covers a broad class of vacuum coating deposition processes in which material is removed from a target or source and deposited onto the surface of a substrate, the process being carried out in a vacuum or partial vacuum (both being referred to herein simply as a vacuum). Exemplary physical vapor deposition techniques include sputter deposition in which material is physically removed from a source or target by sputtering, transfers or travels across a vacuum zone within the vacuum chamber, and condenses or deposits as a coating or film on the surface of the substrate. In reactive sputtering the coating material generated at the target typically reacts with an introduced gas, such as oxygen as or after it deposits on the substrate surface as a coating of the reaction product. Variations of these and other vapor deposition techniques are known, including, ion assisted, e.g., diode or triode sputtering, ion beam sputtering, ion assisted evaporation, planar or cylindrical magnetron sputtering, direct current or radio frequency sputtering, electron beam evaporation, activated reactive evaporation and arc evaporation.

For many applications, the thin film coating on a substrate must be deposited with extreme precision. Optical elements for sensors and optical communication devices, such as wavelength selective thin film filters, mirrors, interleavers and the like useful in optical communication systems, are commercially produced by coating wafers using magnetron sputtering, ion beam sputtering or other vacuum coating deposition techniques. The coated wafer is cut into numerous small optical elements. Typically such optical elements comprise multiple Fabry-Perot film stacks, i.e., multiple resonant cavities each formed of numerous alternating thin films of high and low refractive index materials deposited in sequence onto the surface of an optically transparent wafer. Frequently such optical elements employ multi-cavity coating designs, as in a Fabry-Perot bandpass filter selectively transparent to the narrow wavelength band at the assigned center wavelength of a particular channel in a multi-channel system employing wavelength division multiplexing. To form such optical elements, each cavity (itself a filter) forming the multi-cavity Fabry-Perot coating must be resonant at precisely the same wavelength. That is, the cavities must be optically matched to each other. It is a well-known problem in this industry, however, that coating quality is difficult to adequately control. Typically, monitoring systems used during the deposition monitor the growing film thickness at the monitored point on the wafer. The uniformity and stability of the deposition substantially impacts the yield obtained from the rest of the wafer. The precise thickness and uniformity of each of the multiple layers deposited on a substrate wafer controls the optical properties of the resulting optical elements. Unfortunately, however, considerable uncontrolled variation occurs from one location to the other on the wafer surface during deposition. Variation occurs in film deposition rate from point to point on the surface of the substrate during the deposition, which can result in film thickness differences at different locations on the wafer. Also, considerable uncontrolled variation occurs in film deposition rate over time during a deposition run, potentially resulting in the different stacked cavities forming the filter coating being mismatched. Consequently, much of the surface area of a coated wafer produced in a typical deposition run either has the wrong passband or other optical property or is effectively opaque due to having optically mismatched Fabry-Perot cavities. Thus, yields of useable optical elements from a wafer coated in a typical deposition run are lower than desirable.

As a result of these difficulties, it is a significant problem that the cost of producing such optical elements is high. The problem is exacerbated by the growing need for increased quantities of such optical elements. Their use in sensors, medical devices and other applications is advancing and, most notably, the quantities used in optical communication systems are rapidly increasing in the face of shortages. So-called bandwidth-hungry applications such as the Internet, e-commerce, video-on-demand, public and private web sites and the like are driving rapid installation and upgrading of optical communication system capacity. Moreover, the problem is yet further exacerbated by the demand for ever narrower bandwidth optical elements to accommodate narrower channel spacing in optical communication systems to increase effective bandwidth by dividing the usable spectrum into an ever larger number of multiplexed channels. Equipment and processes currently used in the production of bandpass filters and other Fabry-Perot optical elements have exceedingly low yields of such higher quality optical elements, resulting in costs which are detrimental to implementation of higher density wavelength division multiplexing (WDM) in fiber optic telecommunication systems. As the wavelength spacing between adjacent WDM channels decreases, the precision and quality of the optical elements for thin film filters, mirrors, interleavers and the like must increase. This can be expected to reduce yields, as discussed above, yet yields of optical elements from each deposition run must be increased rather than decreased in order to reduce the cost of the optical elements.

Various suggestions have been made for improving and controlling film deposition.

A modified reactive magnetron sputtering apparatus is suggested in U.S. Pat. No. 4,931,158 to Bunshah et al, wherein a wire grid is positioned over the target and an auxiliary plasma is said to be produced adjacent to the substrate using a positively biased d.c. probe. Deposited film properties are said to be controlled by varying the d.c. probe voltage and the open area of the wire grid.

It is an object of the present invention to provide improved methods and apparatus for PVD vacuum coating deposition, especially sputter deposition. It is a particular object of certain preferred embodiments of the invention to provide methods and apparatus for vacuum coating deposition, which are suitable for producing high precision optical elements for fiber optic communication systems. Other objects and aspects of the invention, generally, or of certain preferred embodiments, will be apparent from the following summary disclosure and/or from the detailed description thereafter of certain preferred embodiments.

SUMMARY

In accordance with various aspects of the inventive technology disclosed here, film deposition is controlled to produce coated substrates having large areas of operative optical coating, for example wafers having large areas suitable to be cut into optical elements operative as high quality Fabry-Perot filters. Without being bound by theory, it may be useful to an understanding of this disclosure to consider that the coating material transferring to the substrate from the target in a sputtering or other PVD process, by application of the various aspects of this inventive technology, is better controlled to reduce variation in the individual films making up the finished Fabry-Perot coating on the substrate. As will be better understood from the following disclosure and the detailed discussion of certain preferred embodiments, the deposition apparatus and systems and the deposition methods disclosed here in some aspects minimize or reduce variation, and in some aspects control variation in the coating material to either reduce or at least temporarily create deposition variation across the substrate to achieve net uniformity or near uniformity or controlled non-uniformity of the deposited films.

In accordance with a first aspect, deposition apparatus and systems are provided for vacuum coating deposition of thin film coatings onto the surface of substrates, such as optical glass wafers, etc. The vacuum coating deposition apparatus comprises a vacuum coating deposition chamber and a superstructure that provides mounting for vacuum coating deposition components within the chamber. The superstructure provides mounting sites for deposition components, such that these components are in fixed position relative each other during the deposition process. Preferably the coating deposition components are mounted to the superstructure in adjustably fixed position, as further disclosed below. The superstructure is structurally isolated from the chamber, meaning that it is at least substantially isolated from such vibrations and flexure as are typically experienced by a deposition chamber during a deposition process. A vacuum deposition chamber, meaning generally the shell, vacuum pumps and other integrated and permanently or semi-permanently attached components which form the vacuum chamber, may experience environmental vibrations and resonant waves from pumping components and the like. Flexure may occur in the chamber walls as a result of temperature changes during the deposition process and due to the pressure differential versus atmosphere as a vacuum is pulled in the chamber. Reference here in the singular to the "wall" of a vacuum chamber should be understood to mean generally the entire air-tight shell, (including, e.g., its door) regardless of the construction or shape of the chamber unless otherwise clear from context.

In accordance with certain preferred embodiments, the superstructure is contained within the deposition chamber. It may comprise a rigid, freestanding member or assembly standing on the floor of the chamber or otherwise mounted therein in any manner effective to substantially isolate it from the aforesaid vibrations and flexure of the chamber. Exemplary arrangements include freestanding the superstructure on dampening pads on the chamber floor or the like, such that it is independent of sidewall flexure and chamber vibrations. The superstructure itself is sufficiently rigid that the deposition components mounted to it are kept in stable position relative one another during the deposition process notwithstanding any such flexure and vibrations.

In accordance with other preferred embodiments, the rigid superstructure is externally anchored or supported, i.e., it is supported outside the deposition vacuum chamber. A portion of the superstructure, referred to here as the chamber portion, may pass through the chamber walls into the chamber, with suitable vacuum seals between them. The chamber preferably is independently supported, either directly on a facility floor or on a support structure. Alternatively, in certain embodiments, it may be supported by the superstructure, e.g., in essentially hanging fashion on a structural member of the superstructure. The chamber portion, i.e., one or more portions or members of the superstructure that provide or serve as mounting sites for the vacuum coating deposition components in the chamber, may extends through an opening in the wall of the deposition chamber or present a mounting site flush with or otherwise proximate such chamber wall openings. Vacuum coating deposition components, e.g., a rotary drive mount for a substrate fixture, a target or source mount, optionally coating monitors, etc., are disposed within the vacuum coating deposition chamber. They are, however, mounted to the chamber portion of the superstructure. The vacuum seals mentioned above, between the chamber wall and the superstructure, advantageously are movement-isolating vacuum seals, such as bellows seals or other suitable seals. The mounting member or chamber portion of the superstructure establishes a fixed relative position or "positionally rigid interconnection" between the deposition components inside the deposition chamber. The mounting member or chamber portion of the superstructure may in certain embodiments be viewed more readily as part of the mounted component and in other embodiments may be viewed more readily as part of the main construct of the superstructure, i.e., as an extended part of the superstructure. It will be apparent to those skilled in this area of technology, that numerous alternative configurations and approaches are suitable for mounting the components to the superstructure. Accordingly, for ease of reference and consistency, such member or portion of the rigid superstructure, i.e., the mounting bracketry and other mounting devices etc., including any portion that passes through the deposition chamber wall (or, if external, sits at an opening in the chamber wall) may be referred to in this discussion and in the appended claims as part of the superstructure. In any event, however, it will be recognized by those skilled in the art, given the benefit of this disclosure, that such mounting member(s) or structure is part of the rigid mounting of the deposition components to the superstructure.

The term "vacuum coating deposition components," as that term is used here and in the appended claims, means at least certain components employed during operation of the apparatus to coat a substrate, typically including, for example, a substrate mount, e.g., a rotary drive mount, coating thickness monitors or sensors, target or other coating material source device. In any event, the vacuum coating deposition components include at least those components whose relative position, i.e., distance from and orientation to each other, inside the chamber effects the uniformity of the coating being formed on the substrate, such as the uniformity of its thickness across the substrate surface. As discussed below, reference here to the relative position of these components being fixed is not intended to mean that their position relative to one another cannot be adjusted. Rather, it means at least that their relative position remains substantially unchanged unless and until adjusted and also remains substantially unaffected by vibrations and flexure in the chamber.

In accordance with certain preferred embodiments, the rigid superstructure of the vacuum deposition apparatus disclosed here further comprises an anchor portion. The anchor portion may comprise a single point or multipoint footing adapted to be seated on or received in a supporting surface. In accordance with certain preferred embodiments, the superstructure is anchored in the ground, extending in self-supporting fashion upwardly from at least one end which is sufficiently deep (pier-like) into the ground to be substantially isolated from vibrations of the building in which the deposition vacuum chamber is housed and operated. The vacuum coating deposition apparatus comprising a rigid superstructure can be used to excellent advantage to deposit high precision thin film coatings with improved uniformity across large substrate area(s).

In accordance with method and product aspects of the technology disclosed here, coated substrates, for example, optical glass wafers, are coated in the vacuum deposition apparatus disclosed above comprising a rigid superstructure. Typically, the substrate is coated with a Fabry-Perot thin film coating so as to be suitable to be divided into multiple band pass filters or other optical elements. Such products can be coated in a deposition chamber employed with the superstructure feature disclosed here, in accordance with known deposition materials and techniques. In accordance with preferred embodiments, however, additional aspects of the technology now disclosed are advantageously employed to provide synergistic improvement in deposition quality and uniformity to achieve excellent overall process control and yield improvement.

In accordance with another aspect, PVD coating precision and quality are improved by deposition control methods and apparatus disclosed here. Specifically, vacuum coating deposition methods and apparatus in accordance with this aspect of the disclosed technology employ a vacuum chamber having a chamber wall. A substrate mount is provided to hold a substrate, e.g., an optical glass wafer to be coated to form high precision optical filter elements, with the substrate working surface, i.e., the substrate surface to be coated, exposed in the chamber. A coating material source apparatus also is provided, comprising a target mount to present the working surface of a target or source material in the chamber. In certain preferred embodiments, the coating material source apparatus is an ion beam sputtering apparatus having a target and an ion gun directing ions toward the target to etch target material during the sputtering process. Exemplary ion beam sputtering apparatus operative in the methods and apparatus disclosed here are known to those skilled in the art, including the ion beam apparatus shown in U.S. Pat. No. 4,793,908 to Scott et al, the entire disclosure of which is hereby incorporated by reference for all purposes. In alternative embodiments, for example, the coating material source apparatus is a magnetron sputtering cathode having a target mount adapted to hold a sputtering target to present the target working surface generally toward the substrate, and having a magnet assembly positioned behind the target mount to exert a confining force on the coating material sputtered from the target working surface during PVD coating of the working surface of a substrate exposed in the chamber. The deposition apparatus further includes componentry for continual monitoring of at least one parameter of the coating deposition and for generating a corresponding control signal. In accordance with certain preferred embodiments, such componentry monitors at least film thickness. More particularly, the deposition apparatus disclosed here, in accordance with such preferred embodiments, is operative to continually monitor film thickness for thin film deposition with excellent film thickness uniformity in each film of an H/L/H type film stack of alternating high and low refractive index materials on an optical substrate. Deposition process parameters continually monitored in various alternative embodiments include, for example, coating apparatus conditions, process conditions, product conditions (i.e., the film or film stack and/or the substrate being coated) and the like. Exemplary parameters suitable for continual monitoring as disclosed here include time elapsed during deposition, thickness and/or optical properties of the individual film being deposited or the multi-layer coating being constructed, time elapsed using the current sputter target, power used in deposition of the current film or with the current sputter target, film thickness, e.g., film thickness at the center of a wafer being coated, at a radius r greater than zero from the center, or at two or more places on the substrate, the distance between the target working surface and the substrate working surface (i.e., the surface being coated), the distance between the target working surface and the magnets in a magnetron sputtering cathode, the temperature of the magnets, the target and/or the substrate, the sputtering voltage, etc. In this regard, it will be understood that monitoring may comprise measuring a value of the parameter in question, detecting the existence of a condition, accumulating and integrating numeric or other data, etc. Monitoring devices, meters and sensors suitable for monitoring various parameter of the coating deposition and for generating a corresponding control signal are commercially available and their use in deposition apparatus and methods in accordance with the principles disclosed here will be readily understood by those skilled in this area of technology given the benefit of this disclosure. The monitoring of a process parameter may involve measuring a value of the parameter and generating a signal corresponding to the measured value. The distance between the target working surface and the substrate surface can be continually measured in accordance with certain especially advantageous embodiments of this aspect of the technology disclosed here. Optical position monitors can be used through view ports in the chamber wall, optionally using known reference points and a triangulation technique or other suitable technique to determine the distance. The control signal generated in this case preferably corresponds to the magnitude of difference between the measured distance and a preselected distance. Monitoring a process parameter, as noted above, may involve detecting the existence or non-existence at the given point in time of a certain condition, such as the attainment of a half-wave film thickness condition or odd QWOT film thickness or other desired film thickness or condition. The signal generated by the sensor or meter may in this case be binary, corresponding to the yes/no nature of the process parameter. In certain embodiments the control signal value may be obtained from a pre-stored look-up table based on the measured value or detected condition. Such look-up table may be stored on any suitable memory device, such as resident or remote ROM memory or the like available to the monitoring component.

The deposition apparatus in accordance with certain embodiments includes componentry for continual control of at least one process variable of the coating deposition operation in the deposition chamber. In accordance with preferred embodiments, such control componentry is responsive to the aforesaid control signal for automatic control of the process variable and optionally is adjusted at a preset rate. The control signal also may be displayed on any suitable user interface, preferably a graphical user interface (GUI) such as an oscilloscope, or an alarm, etc. for responsive action as appropriate by an operator. As used here, process variable control may be carried out to hold the process variable constant during all or some portion of the deposition. Alternatively, the continual control may involve changing the process variable, especially where adjustment of the process variable is used to achieve more uniform or otherwise higher quality or higher yield products. Exemplary of the latter, the relative position (i.e., distance and/or orientation) of the target working surface and the substrate may be continually controlled in response to measured film thickness at multiple locations on a wafer as a Fabry-Perot coating is being constructed in the deposition chamber. Other exemplary process variables suitable for continual control as disclosed here include, but are not necessarily limited to, gas pressure in the vacuum chamber, the position of the target relative to the magnets of a magnetron cathode assembly, power level, temperature of the target, temperature of the substrate, temperature of the magnets etc. In this regard, it will be recognized that in some cases suitable control componentry is commercially available, and in other cases its construction and use in accordance with the principles disclosed here will be readily apparent to those skilled in this area of technology given the benefit of this disclosure. Optionally, the deposition apparatus comprises a rotary drive operatively connected to the sputtering target to impart rotation to the sputtering target during a coating deposition operation.

It should be understood that continual monitoring and continual control as disclosed here may in certain embodiments be implemented as continuous monitoring and control. Alternatively, such continual monitoring and control may involve regularly recurring or frequent monitoring and control suitable to the deposition parameter and the process variable in question and to the desired result. Continuous or more frequent adjustment of the position of the target, for example, may in certain embodiments provide enhanced results over less frequent adjustments. Recurring monitoring and control may in certain embodiments be carried out at regular time intervals, on a preselected schedule or upon the occurrence of preselected events or conditions. It will be within the ability of those skilled in this area of technology, given the advantage of this disclosure, to readily determine suitable monitoring and control frequency to accomplish an intended level of process control.

In accordance with especially preferred embodiments, the continual monitoring of one or more deposition parameters and the continual control of at least one process variable of the coating deposition establish a closed-loop feedback control system for the deposition. Improved deposition uniformity is achieved. Preferred and exemplary process parameters to be monitored are further discussed below along with preferred and exemplary process variables to be controlled based on the control signal generated corresponding to the measured value of the parameter or detected condition, etc. Moreover, other suitable process parameters to be monitored and process variables to be controlled will be readily apparent to those skilled in this area of technology given the benefit of this disclosure.

In accordance with especially preferred embodiments, vacuum coating deposition apparatus is disclosed here, comprising:

a vacuum-tight sputtering deposition chamber having a chamber wall;

an optical glass wafer substrate mounted in a substrate mount and having a substrate working surface exposed in the chamber for coating;

a sputtering target mount;

a sputtering target mounted by the target mount having a target working surface in the chamber;

an optical monitor for continual monitoring of actual or optical film thickness at two locations on the substrate working surface during deposition of a film onto the substrate working surface and for generating corresponding control signals, the target mount being operative to adjust the position of the target working surface relative to the substrate working surface in closed-loop response to the control signals received from the optical monitor corresponding to film thickness. Preferably, the sputtering apparatus is ion beam sputtering apparatus.

From the forgoing disclosure, it will be readily understood by those skilled in the art, that the methods and apparatus of the present invention represent a significant advance in the technology of vacuum coating deposition. In accordance with certain preferred embodiments, improved coating precision and increased yields can be achieved. Additional advantages and other aspects of the invention will be understood from the following more detailed description of certain preferred embodiments, in conjunction with the drawings.

BRIEF DESCRIPTION OF THE DRAWINGS

The following discussion will refer to the appended drawings in which.

Figure 1:
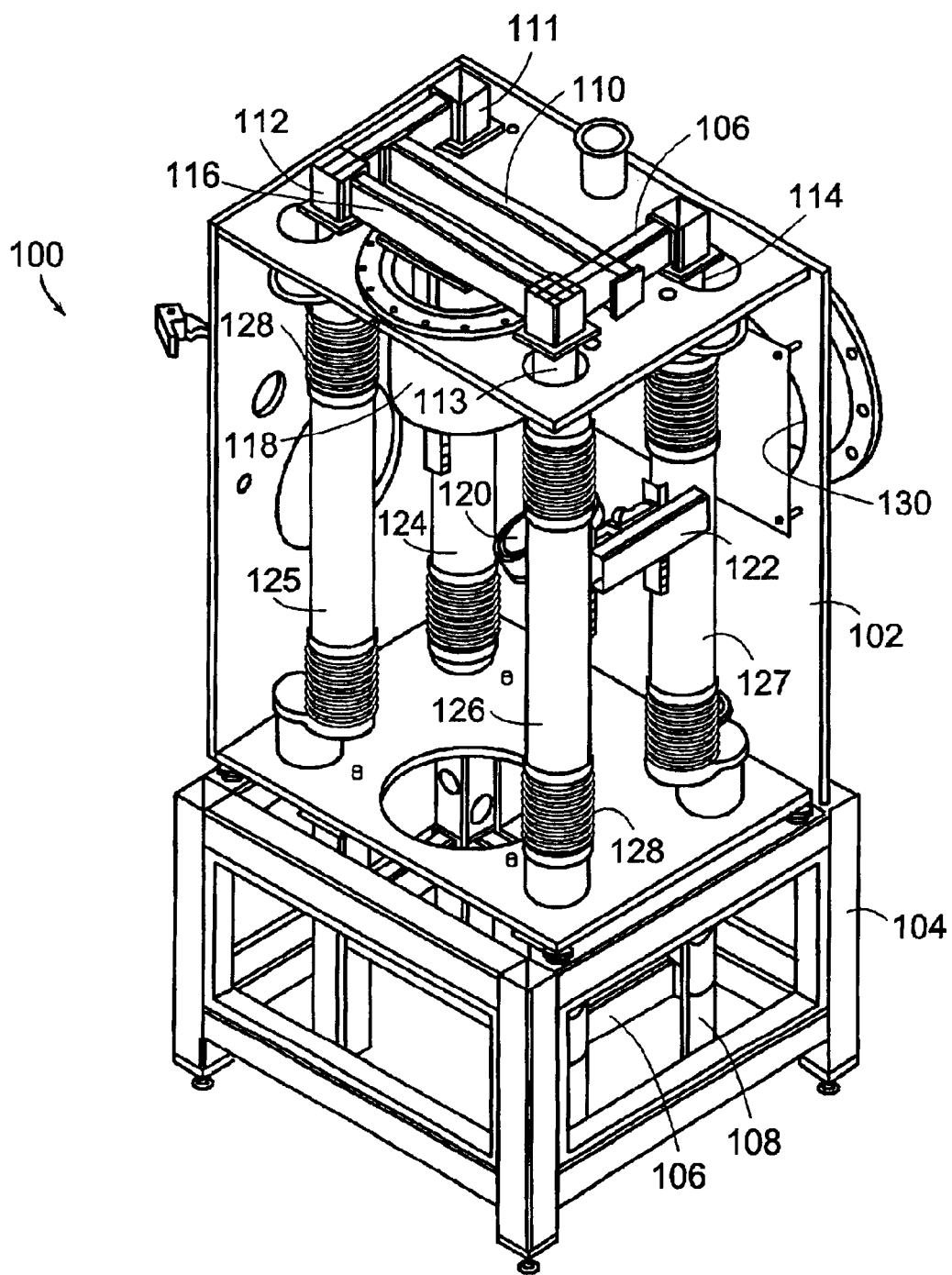
FIG. 1 is a schematic perspective view, partially broken away, of vacuum coating deposition apparatus in accordance with one embodiment of the invention.
Figure 2:
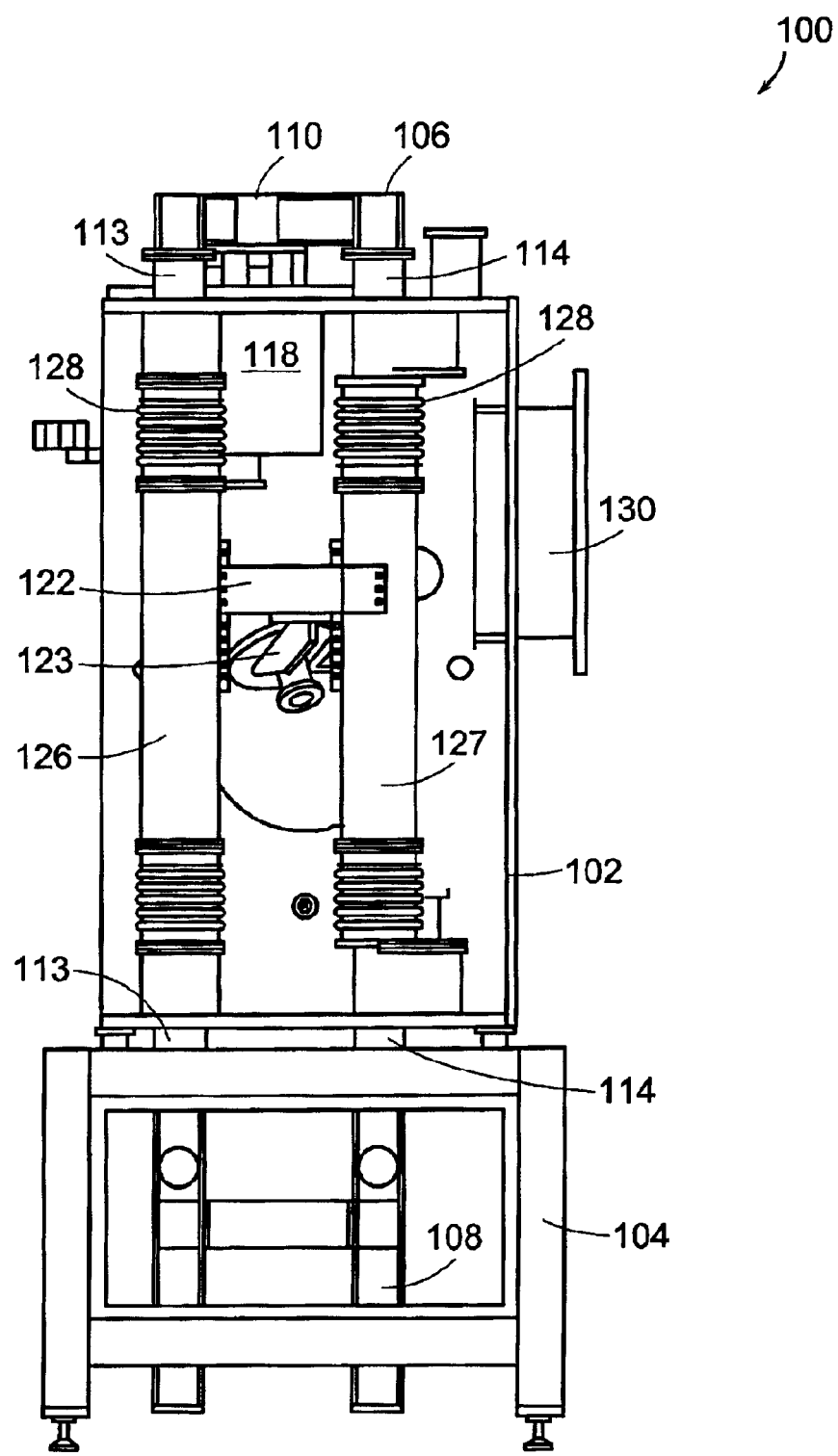
FIGS. 2–4 are schematic elevation views, partially broken away, of the right side and left side (as viewed in FIG. 1) and top view, respectively, of the vacuum coating deposition apparatus of FIG. 1.
Figure 3:
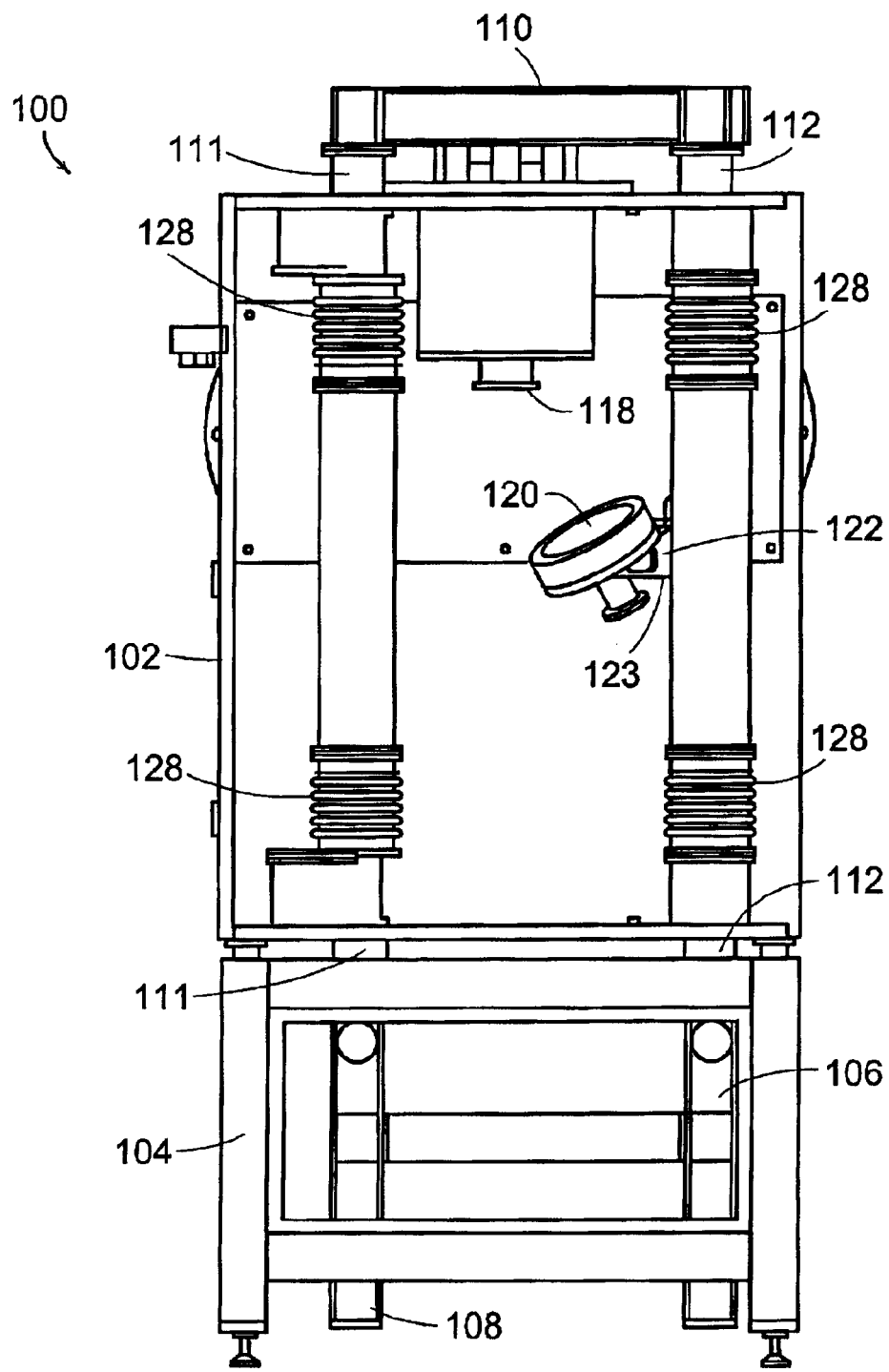
Figure 4:
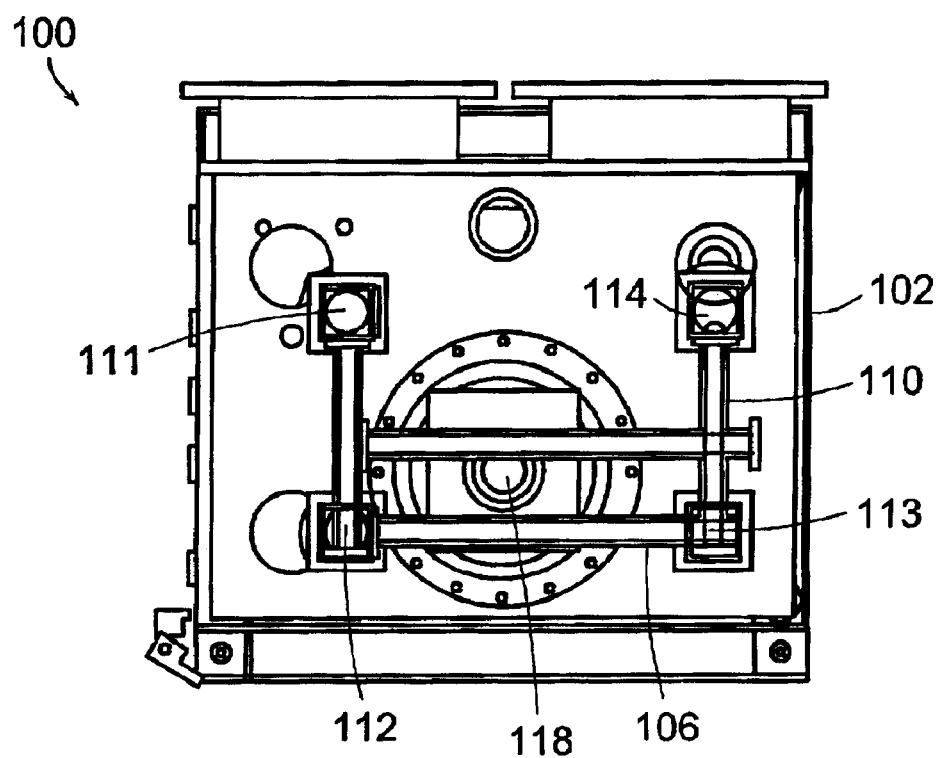

The same reference number may be used for a component or feature in all drawings in which it appears. It should be recognized that the drawings are not necessarily to scale, with some objects shown enlarged for ease of understanding. Directional references in the discussion below refer to the orientation seen in the drawings, unless otherwise clear from the particular context. In all cases, unless otherwise stated, terms such as "up," and "down" and "overhead" and the like have their ordinary meaning, with "up" for example meaning away from the ground and in a direction generally against the pull of gravity.

DETAILED DESCRIPTION OF CERTAIN PREFERRED EMBODIMENTS

It will be readily understood from the above disclosure and from the following description of certain preferred and exemplary embodiments, that the method and apparatus of this invention can be employed in a wide variety of PVD deposition techniques, including sputtering, e.g., ion beam sputtering ("IBS") as disclosed in U.S. Pat. Nos. 5,216,330, 5,240,583 and 5,308,461 issued to Honeywell, the entire disclosure of each of which is hereby incorporated by reference. For purposes of convenience of illustration, and not intending in any way to limit the scope of the invention, the following discussion refers primarily to magnetron sputter deposition embodiments of the invention. Numerous variations in the implementation of the methods and apparatus disclosed here with sputtering or other PVD techniques will be readily apparent to those skilled in the art given the advantage of this disclosure.

In certain preferred embodiments, the combination of two or more of the vacuum deposition control and improvement aspects or features disclosed above and further discussed below cooperate synergistically to provide excellent overall control and improvement. Deposition rate variance over distance from the center of the spinning wafer and over time during the deposition run and, hence, poor coating quality and variance in film thickness and optical properties from one location to another on the wafer may be contributed in certain deposition systems by multiple deposition system parameters. Such contributions may be of the same or different order of magnitude. Thus, each of the deposition system control and improvement features or aspects disclosed above and further discussed below is generally useful in commercial deposition operations to produce improved Fabry-Perot coating quality and/or improved yield of optical elements from a coated wafer. Combinations of multiple such features provide further improvement in certain such deposition systems.

In accordance with certain preferred embodiments, as disclosed above, vacuum coating deposition apparatus employs a superstructure, that is, a structural assembly or single member, such as a massive I-beam or a rigid, integral or unitary construction or assembly of beams, trusses or the like. The superstructure, as disclosed above, supports vacuum deposition componentry independently of the vacuum chamber walls. Those skilled in the art will recognize that in prior thin film deposition arrangements, a vacuum chamber typically is seated on a platform raising it off the floor of the facility, and the vacuum deposition componentry is mounted inside the chamber to the walls, floor or ceiling (all being referred to here simply as the wall or walls unless otherwise clear from the context) of the chamber. In such prior arrangements, the position of the vacuum deposition componentry relative to each other and their distance from each other would change slightly during the deposition of a film due to vibration, flexure, expansion, contraction and other movement of the chamber walls. While slight, this positional variability is seen to adversely effect coating quality and uniformity. Thus, the distance between, e.g., source and substrate would be subject to unwanted changeability during thin film deposition, resulting in loss of film thickness precision and uniformity, with consequent reduction in yield of usable filters or other optical element being produced in the chamber. It is a significant advantage of the vacuum deposition arrangements disclosed here, that a superstructure is employed, such superstructure being sufficiently massive or rigid, and the mountings of the deposition componentry to the superstructure sufficiently rigid, that the distance between components, such as between source, substrate, sensors and the like, and the orientation of such components relative to each other, remains substantially unchanged (or reliably and accurately adjusted) during deposition. That is, in preferred embodiments of the vacuum deposition chamber arrangements disclosed here, distances and orientations and the like remain sufficiently constant during a deposition run that substantially improved uniformity and precision (e.g., thickness precision) can be achieved, resulting in increased yield of usable filters or other optical element being produced in the chamber.

The superstructure in certain embodiments can be housed entirely within the vacuum deposition chamber, as disclosed above. In other embodiments the superstructure is supported or anchored externally of the vacuum chamber and extends to or into the chamber. The chamber portion of the superstructure, that is, the portion of the superstructure that is in the vacuum chamber or positioned at the wall of the chamber, e.g., flush with the chamber wall proximate to a pass-through in the chamber wall to provide mounting sites for deposition components, e.g., the target and substrate mounts, acts as a positional reference point for such componentry. The rigidity of at least the chamber portion of the superstructure ensures t hat the position of the deposition components relative each other will not vary significantly due to vibrations and flexure of the chamber. As disclosed above, however, the deposition apparatus preferably is operative to adjust the position of at least certain deposition components in the chamber relative each other during deposition. That is, the deposition apparatus comprises one or more position adjustors to adjust the position of the substrate mount and the target mount relative to each other during a coating deposition operation in the deposition chamber. Preferably the position adjustor is continually responsive during deposition to a remotely generated control signal corresponding to at least one parameter of the coating deposition operation. In certain embodiments, the target mount is mounted to a sleeve axially adjustably carried on a rigid beam of the superstructure extending into the deposition chamber, and the substrate mount is not mounted to the sleeve (-or vice versa). Movement of the sleeve adjusts the position of the substrate mount and the target mount relative to each other. The position adjustor may suitably comprise a linear motor forming a mounting link between the target mount and the superstructure or between the substrate mount and the superstructure. In other preferred embodiments, the position adjustor comprises a stepper motor with ball screw actuator forming a mounting link between the target mount and the superstructure or between the substrate mount and the superstructure. In other preferred embodiments, the position adjustor comprises a ball screw motor or screw drive forming a mounting link between the target mount and the superstructure[.] or between the substrate mount and the superstructure. In certain preferred embodiments the position adjustor is operative to adjust the distance between the working surface of the sputtering target and the substrate working surface. In other preferred embodiments, the position adjustor is operative to adjust the orientation of the target working surface relative to the substrate working surface, i.e., the angle and/or lateral offset.

In certain exemplary embodiments, the target mount is mounted to a first rigid beam of the superstructure and the substrate mount is mounted to a second rigid beam of the superstructure. The first and second beams of the superstructure are adjustable relative each other such that the position of the substrate mount and the target mount relative to each other is adjustable by adjustment of the position of the first and/or second rigid beam of the superstructure. In certain exemplary embodiments the mounting componentry by which the substrate mount or the target mount is mounted to a beam or other structural component of the superstructure affords positional adjustment, preferably remotely actuatable and controllable positional adjustability. In such embodiments, the substrate mount and the target mount optionally may be carried by the same beam or other structural component of the superstructure. It should be understood that the principles discussed here regarding the adjustably fixed relative position of the substrate mount and the target mount can be applied also to the mounting of other deposition components, such as deposition monitors, secondary targets, shields masks, etc. The rigid superstructure and rigid mounting of the componentry to the superstructure, after any desired adjustment has been made, cooperate to provide constant distance and orientation of the mounted components for improved film deposition precision and uniformity.

Notwithstanding that the chamber portion of the superstructure is "in" the vacuum chamber, meaning either extending or protruding into or even through the interior space of the chamber or extending to a location proximate a pass-through to present one or more deposition component mounting surfaces for deposition components, the superstructure is structurally independent of the chamber wall. The superstructure is sufficiently robust, massive, rigid and/or vibrationally damped that incidental connection between it and the chamber, e.g., the vacuum seals between the superstructure and the chamber wall, do not transmit significant vibration or cause any significant deflection or distortion of the superstructure. Preferably, the superstructure is isolated from the chamber wall to the greatest extent reasonably practicable. Those embodiments wherein the vacuum chamber is itself mounted to the superstructure preferably employ a quite robust, massive and rigid superstructure. In certain embodiments, the superstructure has an anchor portion external to the deposition chamber, which is seated firmly on solid ground or even extends, pier-like, into the ground. The superstructure preferably is ultra-stiff, since increased rigidity will serve to decrease any change in the distance and orientation of the deposition components relative to each other during deposition. Preferably, the entire superstructure is rigid, although in accordance with certain embodiments the superstructure may incorporate shock-absorbing devices such as vibration isolators or dampers. One suitable construction of the superstructure employs welded structural steel I-beams. Alternatively the superstructure can be constructed of welded or otherwise suitably joined hollow steel or other rigid tubing through which controlled temperature water or other fluid can be passed to reduce or eliminate any flexure or thermal expansion of the superstructure due to temperature changes or thermal gradients. Temperature control fluid channels also may be employed together with fluid pumps or the like. In this regard, certain preferred embodiments of the PVD deposition apparatus disclosed here also employ such temperature control features in the mounting devices used for the deposition components, e.g., for the mounting bracketry and the like by which the substrate and target and other deposition components are mounted to the superstructure. Providing cooling fluid or other temperature control feature to the mounting devices reduces or eliminates changes in the relative positions of the deposition components otherwise caused by temperature-induced flexure and thermal expansion of those devices.

In certain preferred magnetron sputter deposition embodiments, deposition components mounted to the superstructure include a rotary drive for the substrate and a magnetron cathode assembly holding the sputter target. Sensors and monitors etc. also may advantageously be mounted to the superstructure, although in certain embodiments they may alternatively be mounted to the superstructure at locations outside the chamber. In accordance with the principles disclosed above, all such componentry is advantageously mounted rigidly to the chamber portion of the superstructure and, therefore, each has a constant distance and orientation relative to the other(s) except to the extent the relative position or orientation of any components is adjusted automatically or by an operator in accordance with other aspects of this disclosure.

A fluid tight seal is provided where the superstructure passes into the vacuum chamber. Optionally, the rigid structural member of the superstructure, i.e., the chamber portion of the superstructure, extends through the vacuum chamber, there being a fluid tight seal at both locations where it passes through the vacuum chamber wall. The seal is a fluid-tight vacuum seal between the chamber wall and the superstructure member where it passes through the wall. The seal preferably is formed of stainless steel sheet or the like, such as in the form of a collar around the superstructure beam where it passes through the wall of the chamber, or bellows seals or the like. The seal should be sufficiently flexible to permit vibration, expansion, contraction and other movement of the chamber wall, such as might typically be experienced during a thin film deposition process, substantially independently of the superstructure. That is, the seal should transmit sufficiently little of such movement to the superstructure as to not cause unacceptable loss of precision and uniformity of deposition. The seal also must be sufficiently robust to withstand rupture or loss of integrity upon exposure to the vacuum pulled in the chamber during deposition. In this regard, both the material of the seal and its connection to the superstructure and the chamber must be sufficiently robust. Suitable bellows seals are commercially available, including, for example, bellows seals Model No. 100763516 (LF 160×7.9") available from MKS Instruments, Inc. (Andover, Mass.). The rigid superstructure optionally provides some or all of the support for the chamber. That is, the chamber may be mounted onto and supported by the superstructure. In accordance with such embodiments, the seal material and construction, including its fluid-tight connection to the superstructure beam and its fluid-tight connection to the chamber wall, must be sufficiently robust to serve such function without impairing its sealing function. Suitable alternative seal materials and seal constructions will be apparent to those skilled in the art given the benefit of this disclosure.

If Referring now to FIGS. 1–4, vacuum coating apparatus 100 is seen to comprise vacuum coating deposition chamber 102 (partially broken away and shown in somewhat simplified schematic fashion for clarity) supported by stand 104 which rests on the floor of the facility. Superstructure 106 is seen to comprise anchor portion 108 sitting on the floor of the facility and chamber portion 110 which includes vertical beam members 111–114 passing through the chamber 102 to overhead horizontal beam construction 116. All of the aforesaid elements or portions of the superstructure are integrated by welding into a single rigid construction. Rotary substrate mount 118 extends downwardly into the chamber from its mounting to the horizontal beam construction 116 of the chamber portion 110 of the superstructure 106. Mounting bellows of the rotary drive form a fluid tight seal with the wall of the chamber 102 and substantially isolates movement of the chamber from the rotary drive and the optical wafer or substrate. Similarly, the target is mounted to the superstructure substantially independently of the vacuum chamber. Target 120 is mounted to the superstructure 106 by bracketry 122. The position of target 120 is fixed relative that of the substrate by the rigid mounting of each to the rigid superstructure 106. Target mounting bracketry 122 comprises position adjustment motor 123 by which the position of the target relative to the superstructure can be adjusted. In this preferred embodiment the adjustment motor 123 of bracketry 122 is responsive, even during deposition, to remotely generated control signals, such that the deposition can be controlled to the extent possible by adjusting the position of the target. Since the superstructure and the mounting of the rotary drive, the sputtering apparatus and other components within the chamber to the superstructure are all extremely rigid, the distance between those components and their orientation relative to each other are all substantially constant, subject, of course, to any adjustment intentionally provided and controlled by the target adjustment motor during or between coating deposition runs in the chamber. Vacuum sealing is accomplished by passing the four vertical beams 111–114 of the superstructure 106 through vertical four corresponding shafts 124–127. A bellows seal 128 is provided at the top and bottom of each shaft. Thus, the four vertical beam members 111–114 of the superstructure 106 passing upwardly through the interior of the shafts 124–127 see normal atmospheric pressure. The exterior of the shafts are exposed to the vacuum inside the chamber 102. The bellows seals provide vacuum sealing without rigid connection: Suitable alternative sealing arrangements will be apparent to those skilled in the art given the benefit of this disclosure, including, for example, vacuum seals comprising flexible sheet steel having a radially inward portion secured in a vacuum-tight manner to a member of the superstructure proximate the chamber wall and having a radially outer portion secured in a vacuum-tight manner to the chamber wall. Vacuum pumping port 130 is provided in the wall of chamber 102.

Especially in the use of this and other highly preferred embodiments for coating of glass or silicon wafers or the like by sputter deposition or other PVD technique, for the production of optical elements for use in demanding optical communication WDM systems, the distances between, and the relative orientation of, the deposition componentry are sufficiently constant during deposition to achieve coating precision and uniformity across more surface area of the wafer than has been achieved in commercial operations using prior known vacuum coating deposition methods and apparatus.

As stated above, the vacuum coating deposition apparatus disclosed here is suitable, or is readily adapted by those skilled in the art, given the benefit of this disclosure, to be suitable for use in the various different vacuum coating deposition techniques. Taking the embodiment of FIGS. 1–4 as an example, a vacuum can be drawn in the chamber 102 with an optical glass wafer or other substrate mounted to the rotary substrate mount 118. The rotary substrate mount 118 mounts the substrate wafer to the superstructure. Thus, unlike traditional vacuum coating deposition apparatus, the wafer is mounted substantially independently of the vacuum chamber. Magnetron sputtering is conducted to deposit high precision thin film coatings of material from the target 120 onto the rotating surface of the substrate. In accordance with certain embodiments, high precision silicon or silica films are deposited from mono-crystalline silicon targets.

Figure 5:
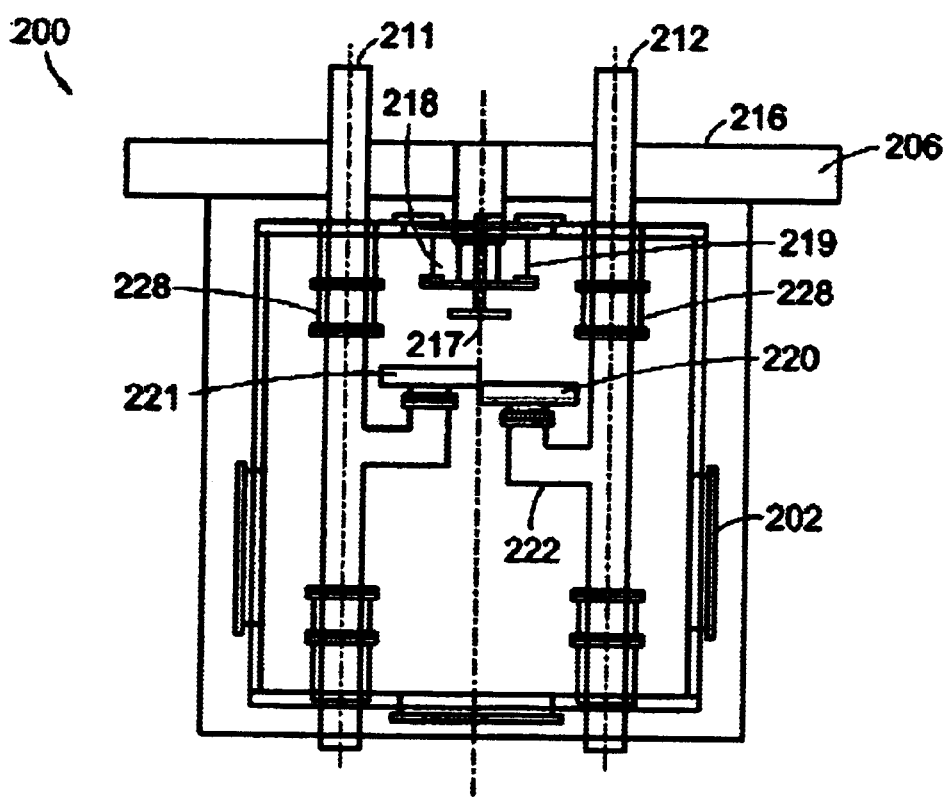
FIGS. 5–8 are schematic elevation views, partially broken away, of vacuum coating deposition apparatus in accordance with other embodiments of the invention.

Referring now to FIG. 5, a schematic elevation section view of vacuum coating apparatus 200 in accordance with an alternative embodiment is seen to comprise vacuum coating deposition chamber 202. Superstructure 206 is seen to comprise vertical beam members 211–212 passing through the chamber 202 to overhead horizontal beam construction 216. A second, substantially symmetrical set of vertical beams, as in the embodiment of FIGS. 1–4, lies out of the plain of the paper in FIG. 5. The elements of the superstructure are integrated by welding into a single rigid construction. A substrate 217 is mounted to rotary substrate mount 218 that extends downwardly from horizontal beam construction 216 into the chamber through movement isolating bellows mounting 219. Mounting bellows 219 of the rotary drive forms a fluid tight seal with the wall of the chamber 202 and substantially isolates movement of the chamber from the rotary drive and the wafer. Similarly, each of a pair of targets 220, 221 is mounted to the superstructure 206 substantially independently of the vacuum chamber. First target 220 is mounted to its vertical superstructure member 212 by bracketry 222. The position of target 220 is fixed relative that of the substrate by the rigid mounting of each to the rigid superstructure 206. Target mounting bracketry 222 comprises position adjustment motor 223 by which the position of the target relative to the superstructure can be adjusted. In this preferred embodiment the adjustment motor 223 of bracketry 222 is responsive, even during deposition, to remotely generated control signals, such that the deposition can be controlled to the extent possible by adjusting the position of the target. Second target 221 is mounted to vertical superstructure member 211 by bracketry substantially the same as that of first target 220. Since the superstructure and the mounting of the rotary drive, the sputtering apparatus and other components within the chamber to the superstructure are all extremely rigid, their relative positions, i.e., the distance between those components and their orientation relative to each other, are all substantially constant, subject to any intentional adjustment. Vacuum sealing is accomplished by passing the vertical beams 211–212 of the superstructure 206 through corresponding vertical shafts 224–225. Bellows seals 228 are provided at the top and bottom of each shaft for vacuum and motion isolation. Thus, the vertical beam members of the superstructure pass upwardly through the interior of the shafts seeing normal atmospheric pressure. The exterior of the shafts are exposed to the vacuum inside the chamber 202.

Figure 6:
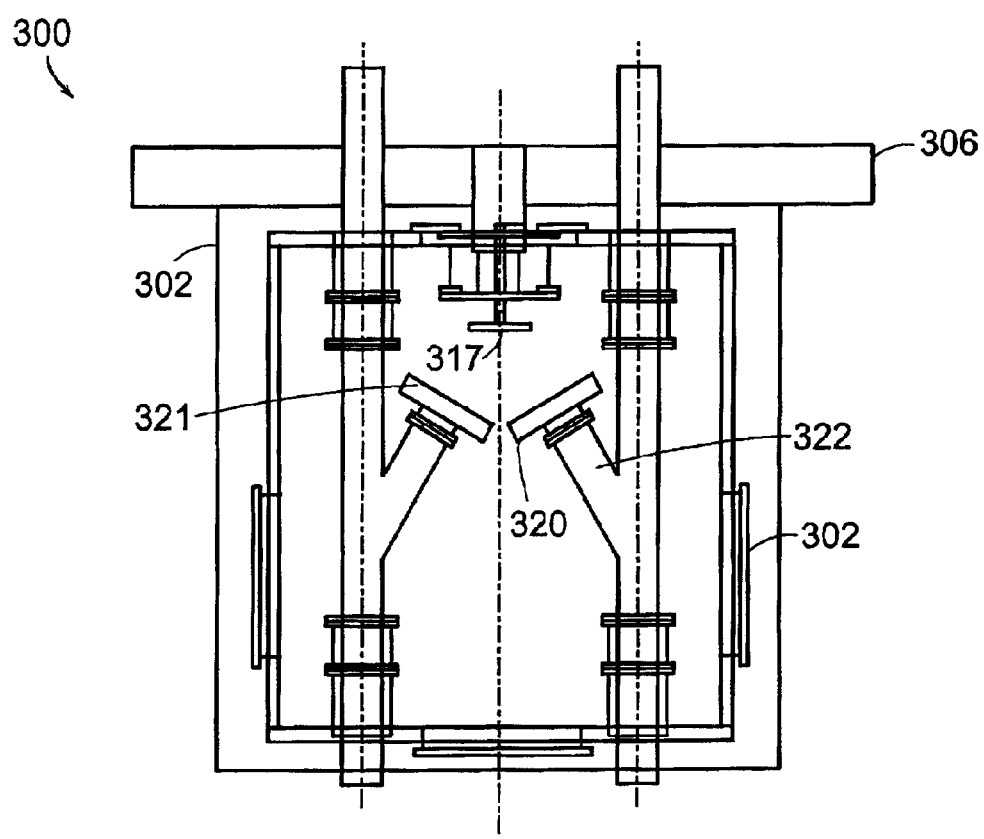
Figure 7:
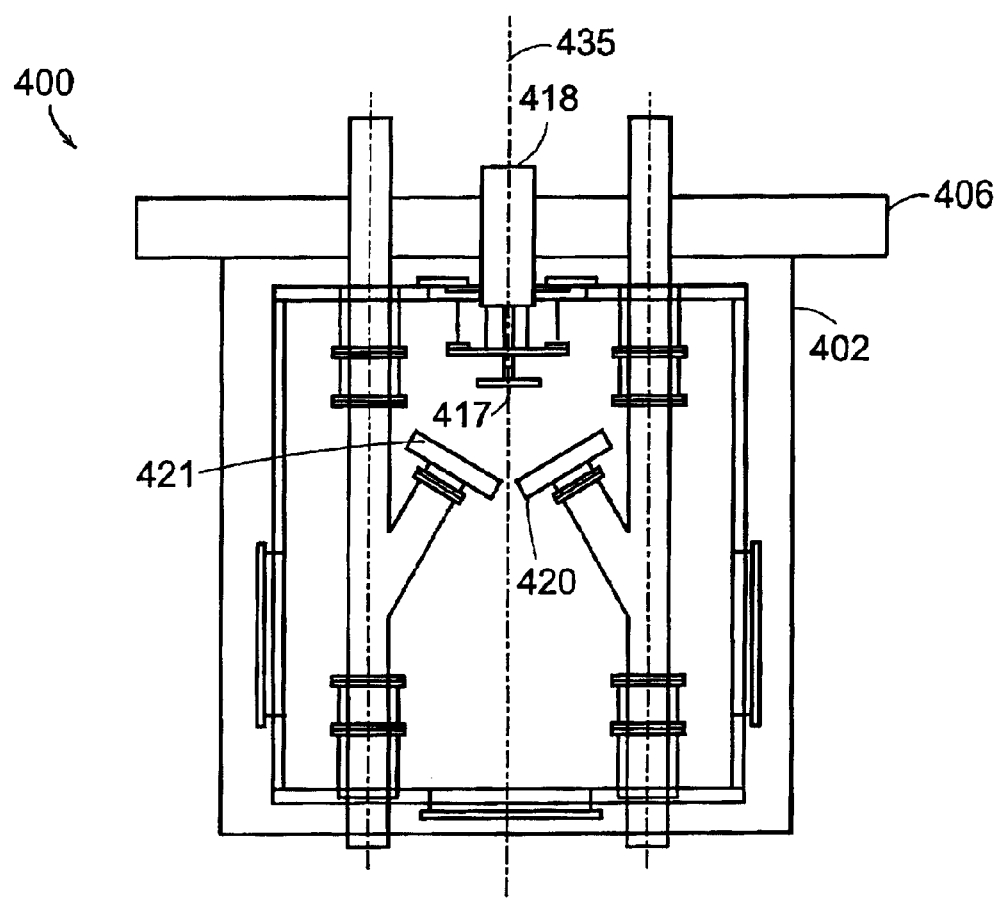
Figure 8:
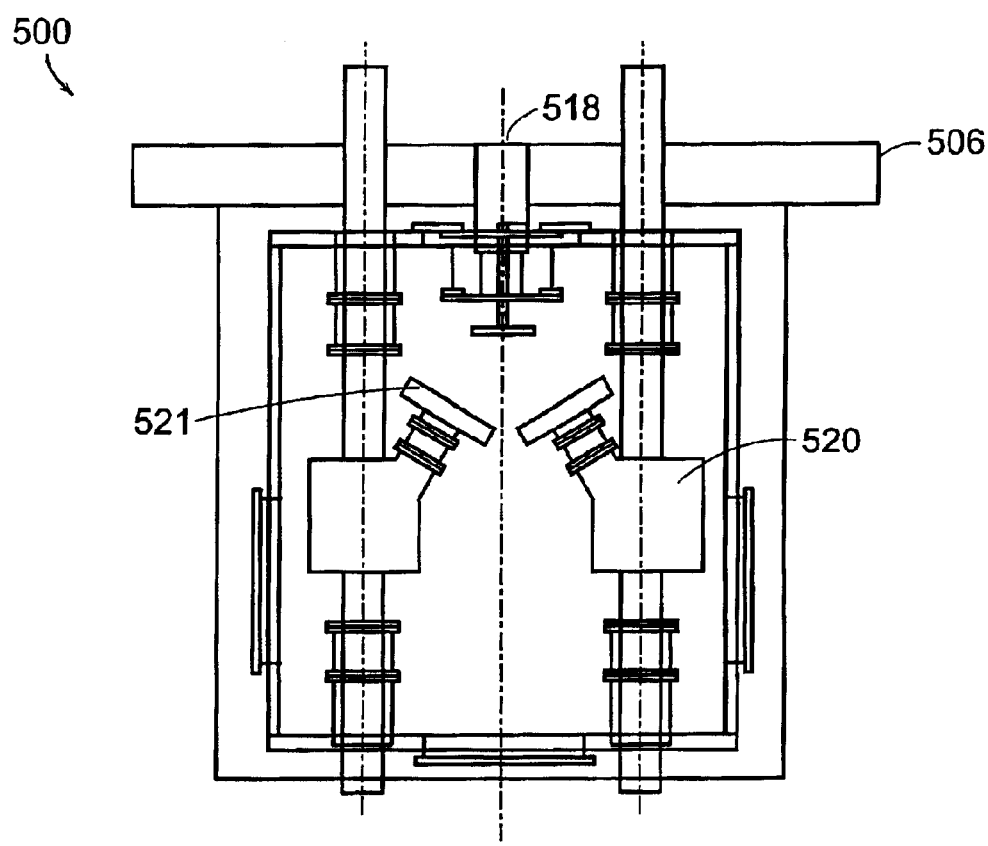

Referring now to FIGS. 6–8, schematic elevation section views are shown in each of vacuum coating apparatus in accordance with alternative embodiments seen to be similar in many respects to the embodiment of FIG. 5 For brevity, the discussion here will focus primarily on the differences between the various embodiments. In FIG. 6 vacuum coating apparatus 300 comprises vacuum coating deposition chamber 302. Each of a pair of targets 320, 321 is mounted to the superstructure 306 substantially independently of the vacuum chamber. Target mounting bracketry 322 for the first target 320 comprises position adjustment motor 323 by which the position of the target relative to the superstructure can be adjusted in the axial direction of bracketry 322. A corresponding arrangement is provided for the second target 321. Whereas the adjustment motor in the mounting bracketry of the embodiment of FIG. 5 would simultaneously change the distance and the orientation of the target to the substrate 317 it can be seen in the embodiment of FIG. 6 that adjustment of the position of first target 320 in the axial direction of its mounting bracketry 322 would substantially preserve the orientation, i.e., the presentation angle. In addition, it will be recognized that in accordance with another aspect of the technology disclosed here, the angled orientation of the targets in the embodiment of FIG. 6 has a further advantage. Specifically, as the target is worn away during sputtering, its angle of orientation is substantially preserved. That is, treating target wear as being primarily in a direction normal to the face of the target, decreased thickness of the target in the embodiment of FIG. 6 changes primarily the distance to the substrate 317, not the angle. The same applies to the substantially mirror image second target 321 in FIG. 6. Thus, in accordance with certain aspects of the technology disclosed here, adjustments can be made to the position of the targets in FIG. 6 continually during deposition to maintain nearly constant distance and orientation. The embodiment of FIG. 7 is substantially like that of FIG. 6, except that vacuum coating apparatus 400 comprises moveable rotary drive mount 418 in lieu of the fixed rotary drive mounts of FIGS. 5 and 6. Moveable rotary drive mount 418 is mounted to superstructure 406. It extends into chamber 402 and rotationally mounts a substrate 417 in fixed position relative targets 420 and 421. The position of the substrate 417 can be adjusted vertically, i.e., axially along centerline 435. In this preferred embodiment the moveable rotary drive mount 418 and the moveable targets all are independently moveable, even during deposition, in response to remotely generated control signals, such that the deposition can be controlled to the extent possible by adjusting the position of the substrate and/or target(s). In the vacuum coating apparatus 500 of FIG. 8 a pair of positionable cathode mini chambers 520, 521 is provided. A fixed rotary drive mount 518 mounted to superstructure 506 is provided in this embodiment.

Figure 9:
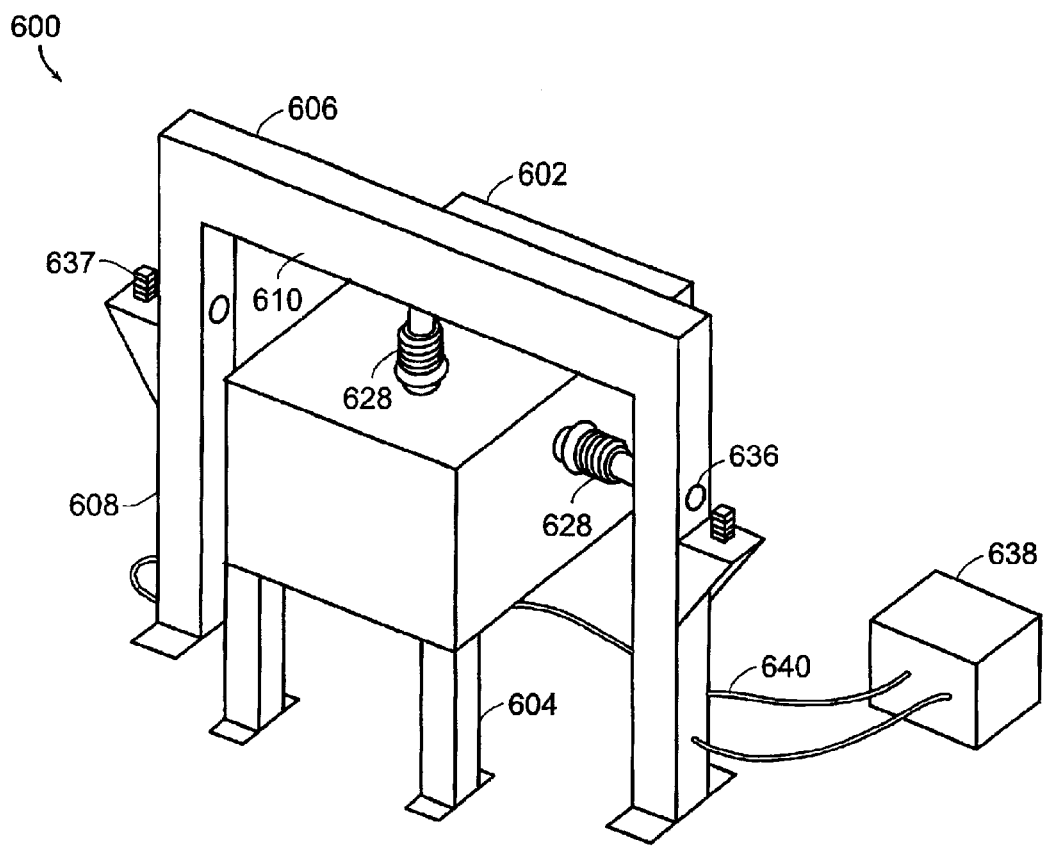
FIG. 9 is a schematic perspective view of vacuum coating deposition apparatus in accordance with an alternative embodiment of the invention.

Referring now to FIG. 9, vacuum coating apparatus 600 in accordance with an alternative embodiment is seen to comprise chamber 602 and superstructure 606. The superstructure 606 extends from anchor portion 608 over the vacuum chamber 602. Superstructure 606 is self-supportingly anchored in the ground, having two vertical legs each extending upwardly from ends anchored sufficiently deep (pier-like) into the ground as to be substantially isolated from vibrations of the building in which the deposition vacuum chamber 602 is housed and operated. As noted above, the superstructure may pass up through the ground floor of the building, preferably not in direct structural contact with the floor or other structure of the building. In accordance with the embodiment of FIG. 9 an upper portion of the superstructure 610 extends over the vacuum chamber. The chamber is supported by structure 604 that rests on the ground. Rather than forming an arch, the superstructure, if sufficiently robust, could have only one anchored end and a free end terminating in or at the chamber. Thus, an I-beam or like superstructure member can be anchored into the ground through the floor of the building in which the vacuum chamber is housed and operated. The free end of the superstructure may be constructed with a boom portion extending laterally from an upwardly extending portion. A tripod superstructure also is suitable for certain applications. In the example shown in FIG. 9 the superstructure includes ports 636 and 637. Suitable alternative constructions for the superstructure will be apparent to those skilled in the art given the benefit of this disclosure. Bellows seals 628 provide a vacuum seal where mounting structure for the deposition components pass through the wall of the chamber. They also preferably provide movement isolation or damping or the like, that is, they isolate the superstructure and, therefore, the deposition components, from any movement of the chamber such as expansion, contraction, distortion or vibration. Fluid line 640 is attached to temperature control device 638 and superstructure 606 to provide cooling fluid or other temperature control feature to the mounting devices.

Figure 10:
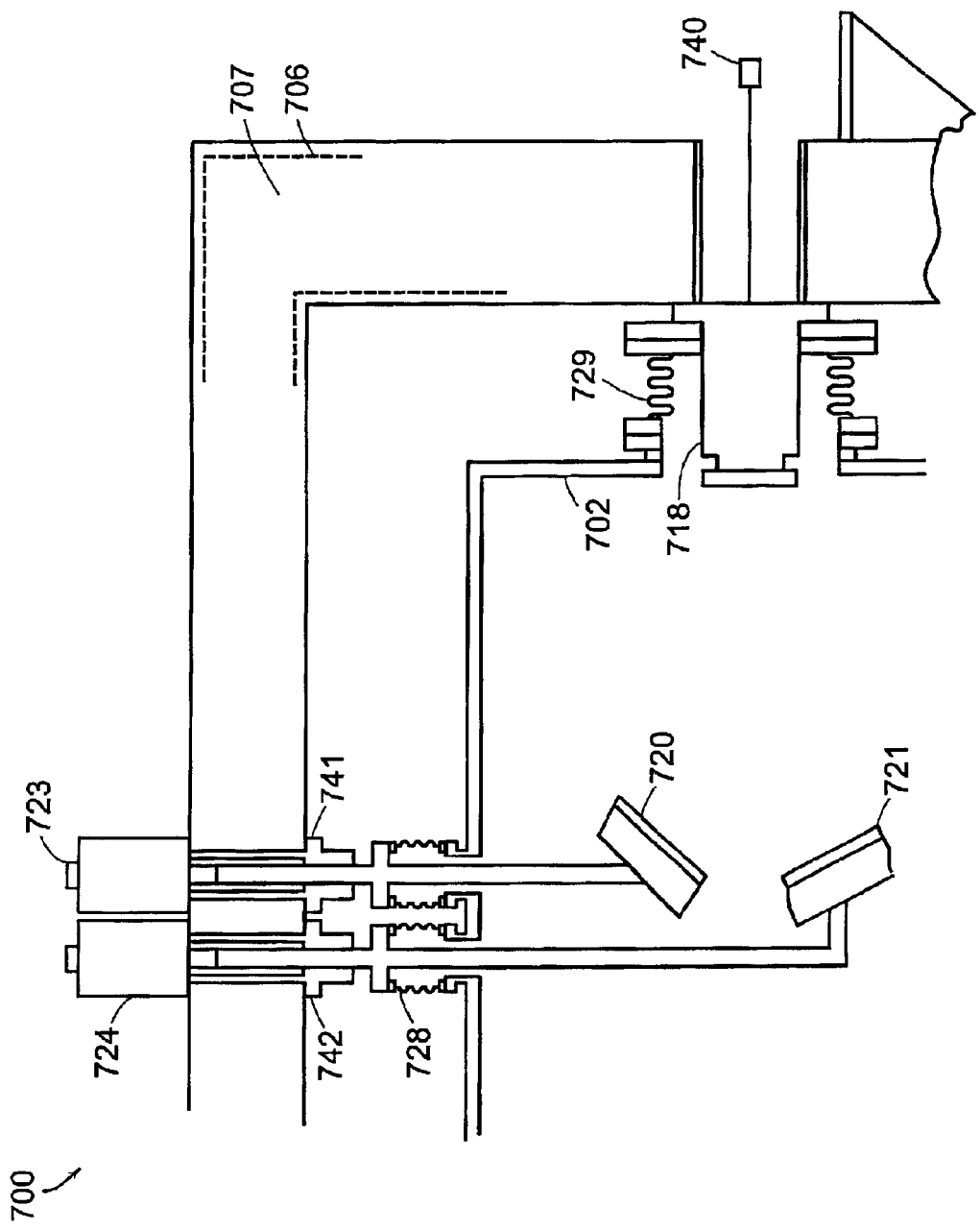
FIG. 10 is a schematic section view, partially broken away, of vacuum coating deposition apparatus in accordance with an alternative embodiment of the invention.

FIG. 10 shows schematically and in partial section, vacuum coating apparatus 700 in accordance with an alternative embodiment. First and second sputtering cathodes 720, 721 are mounted to superstructure 706 by means of first and second tubular linear motors 723, 724, respectively. Good mounting rigidity is provided by linear bearings 741, 742 at the superstructure, and vacuum sealing at the chamber 702 is provided by bellows seals 728. Similarly, bellows seals 729 is provided at substrate mount 718, along with monitoring laser 740. Positional adjustment of the cathodes 720, 721 is in the axial direction of the tubular linear motors, such that the targets are moved laterally relative to the substrate mounting 718. The cathodes are adjustable independently of each other. The superstructure 706 is constructed of hollow tubing or hollow beam members 707, for example 8 inch by 8 inch hollow structural steel beam members having 0.5 inch thick walls. Optionally, temperature control fluid is pumped through the hollow superstructure to reduce thermal expansion and contraction of the superstructure.

Figure 11:
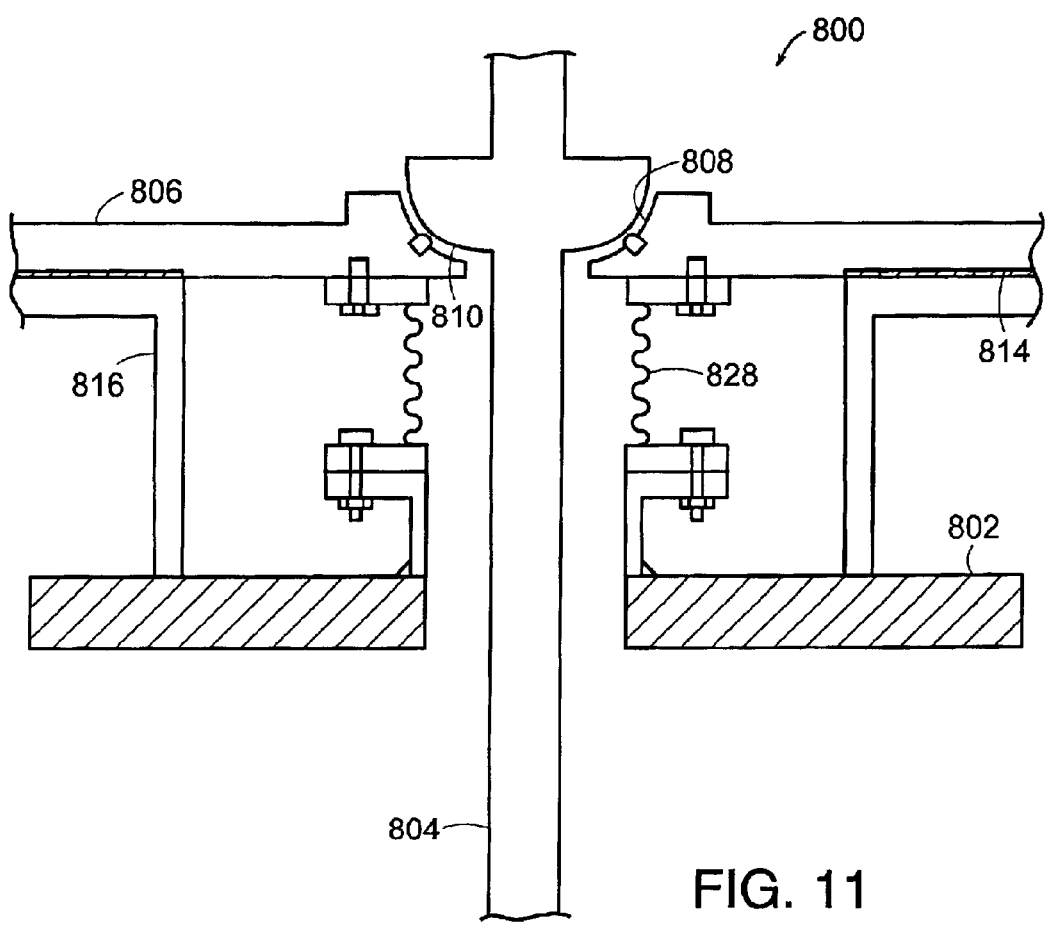
FIG. 11 is a schematic section view, partially broken away, of vacuum coating deposition apparatus in accordance with an alternative embodiment of the invention.

FIG. 11 shows a mounting arrangement for deposition components, such as the target of substrate, in accordance with an alternative embodiment. Vacuum coating apparatus 800 comprises vacuum chamber 802. Rotationally mounted member 804 extends from a superstructure (not shown) into the chamber 802. It is supported by thrust plate 806 which forms hemispherical socket 808 receiving hemispherical bearing portion 810 of member 804. An O-ring seal 812 is provided in the socket 808. A grease layer 814 is provided at the contact area between thrust plate 806 and bellows port side wall 816. A bellows seal 828 provides vacuum sealing. Member 804 is suitable for rotationally mounting a target, a substrate and/or other deposition components in the chamber 802 during deposition.

Figure 12:
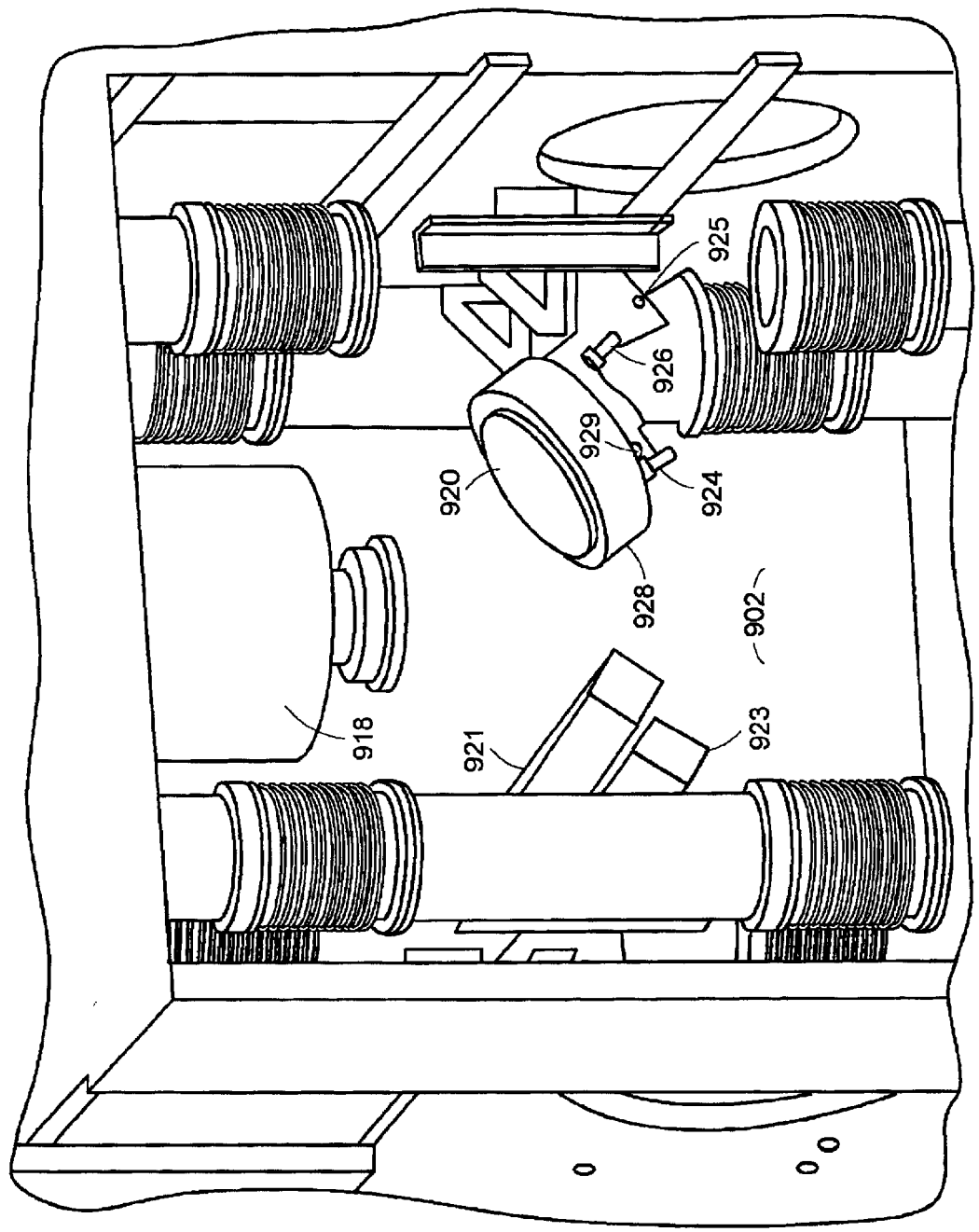
FIG. 12 is a schematic perspective view, partially broken away, of vacuum coating deposition apparatus in accordance with another embodiment of the invention.

FIG. 12 is a perspective view, partially broken away, showing a mounting arrangement for the sputtering targets of vacuum coating apparatus in accordance with an alternative embodiment. The vacuum coating apparatus of FIG. 12 comprises a vacuum chamber 902 in which are positioned a substrate mount 918 and two sputtering targets 920, 921 mounted by target mounting bracketry 923, 924 respectively. The target mounting bracketry 924 (bracketry 923 is substantially identical) comprises linear motor 925 that is operative to control the position Of output shaft 926. Output shaft 926 is attached to target mount member 928 that is pivotal about Pivot shaft 929. Thus, pivot shaft 929 forms an axis of rotation for the target. Rotation of the target will alter its position relative to a substrate mounted at substrate mount 918. By actuation of linear motor 925, the target can be rotated in one direction or the other as desired, to adjust the deposition process.

In accordance with one aspect of the present technology, as disclosed above, sputter deposition apparatus comprises a vacuum chamber and vacuum coating deposition components disposed within the chamber, including at least a substrate mount to hold a substrate with a working surface exposed in the chamber and a coating material source apparatus for generating coating material in the chamber. The coating material source apparatus preferably presents a working surface of a target material in the chamber and the deposition apparatus comprises a target mount to hold the target in the deposition chamber. The deposition apparatus also has means for continual monitoring of at least one parameter of a coating deposition operation in the deposition chamber and for generating a corresponding control signal. In addition, the deposition apparatus has means responsive to the control signal for continual control of at least one process variable of the coating deposition operation in the chamber. In accordance with certain preferred embodiments, the deposition apparatus comprises a monitor for continuous monitoring of the parameter in question during at least a portion of the deposition of a film. In alternative embodiments the parameter is monitored periodically during at least a portion of the deposition of a film, e.g., at regular time intervals, in response to a detected event or condition or on another suitable schedule.

In accordance with certain preferred embodiments, the means for continual monitoring of at least one parameter of a coating deposition operation monitors or determines a value of the parameter and generates a control signal proportional to the value of the parameter. In alternative embodiments, the value of a parameter is determined and the determined value is compared against a preselected limit value. Given the benefit of this disclosure, it will be within the ability of those skilled in this area of technology to implement deposition apparatus suitable to a particular application, incorporating meters, sensors etc for continual monitoring of the process parameters recited above and/or other process parameters.

The sputter deposition apparatus preferably comprises a superstructure structurally isolated from the deposition chamber as disclosed and discussed above. The substrate mount and the target mount in that case each is rigidly mounted to the superstructure in fixed position relative to each other, preferably adjustably fixed position.

In general, it will be recognized by those skilled in the art, given the benefit of this disclosure, that the monitorable parameters of a PVD deposition are frequently to some greater or lesser extent interrelated with—or one and the same as—the process variables to be controlled. Accordingly, the following discussion will first focus primarily on parameters which can be continually monitored in accordance with various embodiments, and then will focus on the process variables which may be controlled based on the values measured, conditions detected or other monitoring resulting in a corresponding signal being generated.

In embodiments employing a target working surface that is etched or sputtered away during the deposition process, such as those employing magnetron sputtering apparatus and processes, the strength of the magnetic field is related to the voltage level at the surface of the target. Higher magnetic field strength traps more electrons at the target surface, resulting in more collisions with the inert sputter gas and, in turn, material is sputtered from the target at a faster rate. As the target etches away, it gets closer to the magnet assembly positioned behind the target and, hence, is subjected to higher magnetic field strength. Thus, erosion of the target during deposition is a process variable related to film deposition uniformity and precision. Accordingly, certain preferred embodiments employ deposition apparatus provided with a self-actuating timer or other suitable means for continual monitoring of elapsed time during deposition of a film. Other deposition process variables impacted directly or indirectly by elapsed time include, for example, film thickness, etc. These and other interrelated process variables may advantageously be continually controlled based on control signals corresponding to continual monitoring of elapsed time. In accordance with certain embodiments, as disclosed above, the position of the target surface is adjusted relative to the magnet assembly to compensate for surface erosion. Preferably, the distance between them is kept substantially constant, although in accordance with other aspects disclosed here, the distance may be adjusted to increase or decrease deposition rate in response to other process parameters monitored.

Since the degree of target etching typically is proportional to the amount and intensity of usage of the target, a number of parameters may be monitored in support of controlling the distance between the target working surface and the magnet assembly. In accordance with certain preferred embodiments, the sputter deposition apparatus has a self-actuating timer or other suitable means for continual monitoring of time duration of sputtering a target during deposition of a film. In accordance with certain preferred embodiments, the sputter deposition apparatus has means for continual monitoring of cumulative power usage in sputtering a target. In accordance with certain preferred embodiments, wherein the deposition apparatus is magnetron sputtering apparatus, the sputter deposition apparatus has means for continual monitoring of the magnetron voltage level during sputtering. As stated above, the interrelatedness of the measurable or detectable or otherwise monitorable process parameters and the controllable process variables in many embodiments of this technology permits alternatives to be selected, redundancy to be designed into the control, etc.

In accordance with certain preferred embodiments, the deposition apparatus comprises a monitor for continual monitoring of thickness of a film as it is being deposited. Suitable monitoring devices, for example, monitor optical transmittance and/or reflectance of the film at a desired wavelength, e.g., the center wavelength of the channel for which the filters are desired. Suitable means include, for example, optical monitors, such as disclosed in U.S. Pat. No. 6,039,806 to Zhou et al, the entire disclosure of which is incorporated herein by reference for all purposes. In accordance with certain preferred embodiments, the means for continual monitoring of at least one parameter of a coating deposition operation is for monitoring actual or optical thickness of a film at the center of a substrate, or at a distance R greater than zero from the center of a substrate. Preferably, actual or optical thickness of a film at the center of a substrate and at a distance R greater than zero from the center of a substrate are monitored. That is, in accordance with one preferred embodiment, the thickness of a film is optically monitored at multiple locations on the substrate as the film is being deposited. Typically, unless the target is offset from the substrate's axis of rotation in the vacuum chamber, the film being deposited will generally grow fastest at the center of the substrate. Therefore, the target is offset and the thickness of the film can be continually monitored as it is being deposited. The quarter wave thickness can be measured for each of multiple locations, and plotted (or otherwise captured for use) as a generally sinusoidal curve over time. Optionally, to reduce the impact of "noise in the measured values, they are converted to an average over time, such as an average over 0.1 to 1.0 minutes, e.g., 40 seconds, of the derivative of the quarter wave curve, that is, a rolling average of the slope of the quarter wave curve. An adjustment of the deposition process is indicated if the gap or difference in value between the rolling average for the center location on the wafer and rolling average for a location at radius R from the center is not constant. Such continual control and adjustment could employ any of several process variables which will be apparent to those skilled in this technology area given the benefit of this disclosure, e.g., changing the distance or orientation of the target to the substrate "Also, the rolling average derivative value can be bit used to set film deposition termination, e.g., to set the switchover points between depositing low refractive index layers and high refractive index layers in building a Fabryr-Perot film stack. Good film thickness control is achieve, for example, by switching from one to the other when the derivative rolling average is at a value corresponding to the peak of the quarter wave curve.

In accordance with certain preferred embodiments, the deposition apparatus comprises a monitor for continual monitoring of distance between a working surface of a sputtering target and a working surface of a substrate during deposition of a film. In accordance with certain preferred embodiments, the deposition apparatus comprises a monitor for continual monitoring of the distance between a working surface of a sputtering target and the magnet assembly of a magnetron sputtering cathode during deposition of a film. The distance can be measured or can be calculated, e.g., based on power used. That is, the power used will correlate to a certain amount of erosion of the target surface, and the distance can be continually adjusted accordingly. Extreme precision is achieved by such continual adjustment, in maintaining this distance constant, and is now seen to yield improved coating precision. It will be recognized in this regard, that ultra-rigid mounting of the substrate, target and optionally other deposition components in accordance with the disclosure above can be implemented together with this continual distance adjustment, with consequent improvement in product yields and coating quality.

In accordance with certain preferred embodiments, the deposition apparatus employs a monitor for continual monitoring of the temperature of the magnets of a magnetron sputtering cathode during deposition of a film. Suitable magnetron magnet temperature monitoring devices include, for example, thermocouple sensors. In accordance with certain preferred embodiments, the deposition apparatus comprises a temperature monitor for the temperature of a sputtering target during deposition of a film. Suitable target temperature monitoring devices include, for example, thermocouple sensors or pyrometers. In accordance with certain preferred embodiments, the deposition apparatus has a temperature monitor for the temperature of the substrate, such that substrate temperature can be continually monitored during deposition of a film. Suitable monitoring devices include, for example, optical pyrometers that can operate through a window in the chamber wall, and thermocouple sensors with split ring electrical connections. As discussed above, significant improvement in film deposition quality and uniformity are achieved by continual control of deposition process variables in accordance with preferred embodiments of the apparatus and methods disclosed here. In particular, significant improvement is now achieved by continual monitoring of one or more process parameters, as discussed in detail above, and continual control of one or more process variables in response to a control signal generated by the monitoring device or by an associated signal generation device, to provide closed-loop control. In accordance with certain preferred embodiments, deposition apparatus comprises means for continual control of the position of a working surface of a sputtering target and the working surface of a substrate relative each other. In alternative embodiments the means for continual control of the position of a working surface of a sputtering target and the working surface of a substrate relative each other is adapted to control distance between them. In alternative embodiments, the means for continual control is for controlling orientation of a working surface of a sputtering target mounted in the target mount relative to a working surface of a substrate mounted in the target mount. In accordance with certain preferred embodiments, the controller adjusts the position of a working surface of a sputtering target mounted in the target mount. In certain embodiments, the controller adjusts the position of a substrate mounted in the substrate mount. Numerous such apparatus are disclosed and described above. It is well within the ability of those skilled in this area of technology to incorporate actuators for linear motors or other target moving mechanism or substrate moving mechanism, that is responsive to control signals based on monitored distance changes between these components.

In accordance with certain preferred embodiments, the coating material source apparatus comprises a magnetron sputtering cathode and the process variable controller controls at least the position relative each other of the working surface of the sputtering target and the magnets of the magnetron sputtering cathode. In certain embodiments, the distance between them is controlled. In certain embodiments, the orientation of one to the other is controlled. The deposition apparatus may adjust the position of the magnets or the position of the target. An adaptable device for such purpose, although taught for the different purpose of varying the magnet location relative to the target to vary the voltage and consequently the alloy composition sputtered from the target, is seen in U.S. Pat. No. 4,927,513, the disclosure of which is incorporated herein by reference for all purposes. In certain preferred embodiments, the target is adjusted toward the substrate to accomplish simultaneously a compensation for the distance increase between the target and the substrate and for the distance decrease between the target and the magnets, both caused by the erosion of the target. Suitable controllers are readily commercially available, including, for example linear actuators and like devices mentioned above. Optionally, a double axial piston can be used, such that the distance between the target and the substrate and the distance decrease between the target and the magnets each can be controlled independently of the other along the same axis of motion.

In accordance with certain preferred embodiments, the deposition apparatus comprises a controller responsive to the control signal from a monitoring device, for continual control of power to the magnetron sputtering cathode.

In accordance with certain preferred embodiments, the deposition apparatus comprises a controller responsive to the control signal from a monitoring device, for continual control of the temperature of the magnets of the magnetron sputtering cathode. Suitable controllers include, for example, temperature control fluid lines, e.g., cooling fluid lines to the magnetron and the like. In accordance with certain preferred embodiments, the temperature of the cooling fluid is continually monitored and a control signal is sent to the cooling fluid controller to adjust the cooling fluid temperature and/or flow rate as needed to either hold the magnet temperature constant or adjust it as a process variable to indirectly control deposition rate and quality. In accordance with certain preferred embodiments, the deposition apparatus comprises a controller responsive to the control signal from a monitoring device, for continual control of the temperature of a target or other coating material source. Suitable controllers include, for example, temperature control fluid lines, e.g., cooling fluid lines to the target mount and the like.

In accordance with certain preferred embodiments, the deposition apparatus comprises a controller responsive to the control signal from a monitoring device, for continual control of the temperature of a substrate mounted in the substrate mount. Suitable controllers include, for example, apparatus comprising a pyrometer, e.g., Model 4500A-C-20 available from Williamson Company (Concord, Mass.), that is adapted to generate an electronic signal corresponding to the temperature of the substrate. The signal from the pyrometer can be fed to, and received by, a control computer, such as a programmable logic computer (PLC), that is operative to process such signal for selective actuation of suitable heating and/or cooling apparatus. Suitable heating/cooling apparatus includes, for example, one or more radiant heaters, such as quartz heaters, mounted preferably within the vacuum chamber and powered by an SCR power source. Preferably, the controller is operative to maintain a substantially constant substrate temperature during at least a predetermined portion of the coating deposition operation. In certain preferred embodiments, the substrate temperature controller is operative to deliver temperature control fluid to the substrate mount. Certain preferred embodiments employ quartz heaters mounted in the chamber to heat the substrate and/or other components of the deposition apparatus. In this regard, it is especially advantageous to operate the substrate temperature controller to reduce or eliminate temperature variation from the deposition of one film of a coating to the next. Temperature differences in the substrate, and therefore in the deposited film, result in thermal expansion differences. If the film thickness is optically monitored and controlled, its optical thickness will be a function of its physical thickness. If a second film is deposited at a different temperature, it will undergo thermal expansion or contraction upon cooling different from that of the prior deposited film. Accordingly, continual monitoring and control of substrate temperature in accordance with preferred embodiments of this disclosure provides improved coating quality. In accordance with certain preferred embodiments, the substrate may be fitted with a good thermal conductor as a temporary backing plate serving as a thermal sink and/or a conduit for a flow of temperature control fluid. Optical through holes in the backing plate will allow optical monitoring of the coating being deposited on the substrate.

In accordance with certain preferred embodiments, separate temperature controllers are provided for continual control of the temperature of the substrate, the magnetron magnets, and optionally the chamber generally. Thus, temperature differences between these components can be maintained, corrected, adjusted etc during the deposition of a film onto the substrate. Front surface and back surface heaters, for example, one or more radiant heaters, such as quartz heaters, advantageously are provided for the substrate, preferably being separately controlled.

It will be understood from the forgoing discussion that for any of the PVD deposition process variables controlled, it will generally be preferred to control the process variable continually during at least a portion of the deposition of a film. Thus, as noted above, the controller may control the process variable continuously or periodically or the like. It may maintain the process variable at a constant value or condition or it may adjust the process variable to control film deposition rate and/or quality on a substrate working surface.

In accordance with certain especially advantageous embodiments, vacuum coating deposition apparatus comprises a vacuum chamber, an optical glass wafer substrate mounted in a substrate mount and having a substrate working surface exposed in the chamber for coating, a sputtering target mounted in the target mount of a magnetron sputtering cathode and having a target working surface in the chamber, and an optical monitor for continual monitoring of film thickness at two locations on the substrate working surface during film deposition. The optical monitor comprises a signal generator for generating a corresponding control signal. A position controller, e.g., as discussed above, is responsive to the control signal to continually adjust the position of the target working surface in the chamber during at least a portion of a coating deposition operation. That is, the controller adjusts as needed the position of the target working surface relative to the substrate working surface. Preferably, the position controller is computer actuated automatic adjustment linear motor or the like for moving the sputtering target. Alternatively, the controller is operator actuated adjustment means for moving the sputtering target. An adaptable device for such purpose, although not recognized for its potential adaptability to continual adjustment during film deposition, is seen in U.S. Pat. No. 4,978,437, the disclosure of which is incorporated herein by reference for all purposes. Preferably, the controller has a graphical user interface displaying the control signal.

In accordance with a method aspect of the technology disclosed here, a PVD deposition method for vacuum deposition of thin film coatings onto a surface of a substrate comprises:

providing a vacuum-tight deposition chamber having a chamber wall;

mounting vacuum coating deposition components within the deposition chamber to a superstructure structurally isolated from the deposition chamber, including at least a substrate mount holding a substrate with a substrate working surface exposed in the chamber and a coating material source apparatus comprising a target mount holding a target in the deposition chamber, the substrate mount and the target mount each being rigidly mounted to the superstructure in fixed position relative to each other;

energizing the coating material source apparatus; and coating the substrate working surface.

In accordance with another preferred embodiment of the deposition method, a method for vacuum deposition of thin film coatings onto a surface of a substrate, comprises:

providing a vacuum chamber having a chamber wall;

mounting vacuum coating deposition components within the deposition chamber, including at least a substrate mount holding a substrate with a substrate working surface exposed in the chamber and a coating material source apparatus comprising a target mount holding a coating material target in the deposition chamber;

energizing the coating material source apparatus and commencing deposition of a coating onto the substrate working surface;

continually monitoring at least one parameter of the coating deposition and generating a corresponding control signal during at least a major portion of the deposition of a coating onto the substrate working surface; and continually controlling at least one process variable of the coating deposition in response to the control signal during at least a major portion of the deposition of a coating onto the substrate working surface.

As noted above, in certain preferred embodiments one or more control mechanisms are provided for continual adjustment of their respective process variables during at least a predetermined portion of a coating deposition operation, e.g., to maintain a substantially constant distance between the working surface of the plasma source material and the working surface of the substrate. Preferably more than one parameters of the deposition, i.e., parameters of the deposition apparatus or process, are monitored continually, each by a suitable sensor or meter having an associated signal generator to generate a signal corresponding to one or a combination of the monitored parameters.

As discussed above, in accordance with certain preferred embodiments the distance between the working surface of the target and the working surface of the substrate are continually monitored to generate a corresponding distance signal. The distance adjustment apparatus receives and is responsive to such control signal to continually adjust the position of the target relative to the substrate during at least a portion, most preferably a major portion, of the deposition. Reference here to a major portion of a deposition means more than half and preferably substantially the entire duration of the deposition except any portion(s) thereof when adjustments are advantageously avoided for other reasons. In certain deposition processes carried out in accordance with this disclosure, extreme precision is achieved in maintaining a constant distance between the working surface of the coating material source apparatus and the working surface of the substrate to yield excellent coating precision, most preferably excellent coating thickness uniformity. In other preferred embodiments continual control of the distance results in deliberate increase and/or decrease from time to time during the deposition to achieve a desired uniformity of film thickness or other desired film property. It will be recognized in this regard, that a rigid superstructure mounting of the substrate and target in accordance with the disclosure above can be implemented together with this aspect of continual distance adjustment to control source-to-target distance with excellent precision, leading to consequent improvement in product yields and coating quality.

In certain preferred embodiments an optical pyrometer or other temperature sensor continually monitors the temperature of the substrate during at least a predetermined portion of a coating. The sensor generates a corresponding substrate temperature signal. The substrate temperature adjustor receives and is responsive to the substrate temperature signal to maintain a substantially constant substrate temperature by continually adjusting the substrate temperature. In a highly advantageous aspect, such temperature adjustment is performed independently, that is, without resort to changing the power level, voltage or other such deposition parameter, which introduce unacceptable coating imprecision. In exemplary embodiments the temperature adjustment means is in fluid communication with the substrate mount and operates by delivering temperature adjustment fluid, such as cooling/ heating air or water etc., to the substrate mount. In such embodiments the substrate temperature adjustment device preferably comprises fluid communication conduit between the substrate mount and a source of temperature adjustment fluid. Excellent precision is achieved by such continual adjustment, in maintaining the temperature of the substrate constant, which now is seen to yield improved coating precision. It will be recognized in this regard, that an ultra-rigid mounting of the substrate, target and optionally other deposition components in accordance with the disclosure above can be implemented together with this continual temperature adjustment, with consequent improvement in product yields and coating quality.

The embodiments described above are exemplary of the present invention. It will be apparent to those skilled in the art that there are alternative embodiments and modifications and additions which can be made, consistent with the various aspects and principles disclosed. The following claims are intended to cover such disclosed embodiments and alternative embodiments and modifications and additions within the true scope and spirit of the invention.

What is claimed is:

1. Apparatus for vacuum deposition of thin film coatings onto a surface of a substrate, comprising:

a vacuum-tight deposition chamber having a chamber wall;

vacuum coating deposition components disposed within the deposition chamber, including at least a substrate mount to hold a substrate with a working surface exposed in the chamber and a coating material source apparatus comprising a target mount to hold a coating material target in the deposition chamber for PVD coating of a working surface of a substrate exposed in the chamber; and a superstructure structurally isolated from the deposition chamber, the substrate mount and the target mount each being rigidly mounted to the superstructure in fixed position relative to each other.

2. The apparatus for vacuum deposition of thin film coatings in accordance with claim 1 wherein the superstructure is housed entirely within the deposition chamber.

3. The apparatus for vacuum deposition of thin film coatings in accordance with claim 1 wherein at least a portion of the superstructure is external to the deposition chamber.

4. The apparatus for vacuum deposition of thin film coatings in accordance with claim 3 wherein a chamber portion of the superstructure is vacuum sealed to the chamber wall.

5. The apparatus for vacuum deposition of thin film coatings in accordance with claim 4 wherein the superstructure is vacuum sealed to the chamber wall by at least one bellow seal.

6. The apparatus for vacuum deposition of thin film coatings in accordance with claim 1 further comprising:

a monitor for continual monitoring of at least one parameter of a coating deposition operation in the deposition chamber and for generating a corresponding control signal; and controller responsive to the control signal for continual control of at least one process variable of a coating deposition operation in the deposition chamber.

7. The apparatus for vacuum deposition of thin film coatings in accordance with claim 1 wherein the substrate mount and the target mount are mounted to the superstructure in adjustably fixed relative position.

8. The apparatus for vacuum deposition of thin film coatings in accordance with claim 7 further comprising a position adjustor responsive to a control signal corresponding to at least one parameter of a coating deposition operation in the deposition chamber, to adjust the position of the substrate mount and the target mount relative to each other during a coating deposition operation in the deposition chamber.

9. The apparatus for vacuum coating deposition of thin film coatings in accordance with claim 8 wherein the target mount is mounted to a rigid beam of the superstructure extending into the deposition chamber and the substrate mount is not mounted to the rigid beam, and the position of the substrate mount and the target mount relative to each other is adjusted by movement of the rigid beam.

10. The apparatus for vacuum coating deposition of thin film coatings in accordance with claim 8 wherein the target mount is mounted to a sleeve axially adjustably carried on a rigid beam of the superstructure extending into the deposition chamber, and the substrate mount is not mounted to the sleeve, and the position of the substrate mount and the target mount relative to each other is adjusted by movement of the sleeve.

11. The apparatus for vacuum coating deposition of thin film coatings in accordance with claim 8 wherein the position adjustor comprises a linear motor forming a mounting link between the target mount and the superstructure.

12. The apparatus for vacuum coating deposition of thin film coatings in accordance with claim 8 wherein the position adjustor comprises a stepper motor with screw actuator forming a mounting link between the target mount and the superstructure.

13. The apparatus for vacuum coating deposition of thin film coatings in accordance with claim 8 wherein the position adjustor comprises a ball screw motor forming a mounting link between the target mount and the superstructure.

14. The apparatus for vacuum deposition of thin film coatings in accordance with claim 8 wherein the distance between a working surface of a sputtering target mounted in the target mount and a substrate working surface of a substrate mounted in the substrate mount is adjustable by the position adjustor.

15. The apparatus for vacuum coating deposition of thin film coatings in accordance with claim 14 wherein the deposition chamber is supported by the superstructure.

16. The apparatus for vacuum deposition of thin film coatings in accordance with claim 8 wherein the orientation of a working surface of a sputtering target mounted in the substrate mount relative to a substrate working surface of a substrate mounted in the target mount is adjustable by the position adjustor.

17. The apparatus for vacuum deposition of thin film coatings in accordance with claim 1 wherein the superstructure is anchored in the ground.

18. The apparatus for vacuum deposition of thin film coatings in accordance with claim 1 further comprising a film monitor rigidly mounted to the superstructure in fixed position relative to the substrate mount and the target mount.

19. The apparatus for vacuum deposition of thin film coatings in accordance with claim 1 further comprising temperature control fluid delivery conduit and a temperature control fluid pump actuated in response to the temperature of the superstructure.

20. The apparatus for vacuum deposition of thin film coatings in accordance with claim 1 further comprising a temperature control fluid pump, wherein at least a chamber portion of the superstructure comprises rigid hollow beams in fluid communication with the temperature control fluid pump.

21. The apparatus for vacuum deposition of thin film coatings in accordance with claim 1 wherein the superstructure comprises temperature control fluid channels and a cooling fluid pump in fluid communication with the cooling channels.

22. The apparatus for vacuum deposition of thin film coatings in accordance with claim 1 wherein the target mount comprises cooling channels and a cooling fluid pump in fluid communication with the cooling channels.

23. The apparatus for vacuum deposition of thin film coatings in accordance with claim 1 wherein the superstructure further comprises an anchor portion external to the deposition chamber.

24. The apparatus for vacuum coating deposition of thin film coatings in accordance with claim 1 wherein the coating material source apparatus is an ion beam sputtering ("IBS") device.

25. The apparatus for vacuum coating deposition of thin film coatings in accordance with claim 1 wherein the substrate mount is a rotary drive mount.

26. The apparatus for vacuum coating deposition of thin film coatings in accordance with claim 1 wherein the coating material source apparatus is a magnetron sputtering cathode, the target mount is adapted to mount a sputtering target to present a sputtering target working surface in the chamber, and the sputtering apparatus comprises a magnetron sputtering cathode comprising a magnet assembly positioned behind the target mount to exert an electromagnetic confining force at the sputtering target working surface during coating deposition.

27. The apparatus for vacuum coating deposition of thin film coatings in accordance with claim 26 wherein the target mount is mounted to the superstructure through the magnetron sputtering cathode, and the magnetron sputtering cathode is mounted to the superstructure via a magnetron mount comprising cooling fluid channels in fluid communication with a fluid pump actuated in response to a control signal from a temperature signal exposed to the temperature of the magnetron mount.

28. The apparatus for vacuum coating deposition of thin film coatings in accordance with claim 26 wherein the magnetron mount comprises a screw drive for axial adjustment of the position of the magnet assembly relative the superstructure independent of the position of the target working surface relative the superstructure.

29. Apparatus for vacuum coating deposition of thin film coatings on a surface of a substrate, comprising:

a vacuum-tight deposition chamber having a chamber wall;

vacuum coating deposition components disposed within the deposition chamber, including at least a substrate mount to hold a substrate with a working surface exposed in the chamber and a coating material source apparatus comprising a target mount to hold a coating material target in the deposition chamber for PVD coating of a working surface of a substrate exposed in the chamber; and a superstructure structurally isolated from the deposition chamber, the substrate mount and the target mount each being rigidly mounted to the superstructure in fixed position relative to each other, and the superstructure comprising at least an anchor portion external to the deposition chamber and a chamber portion vacuum sealed to the chamber wall.

30. The apparatus for vacuum coating deposition of thin film coatings in accordance with claim 29 wherein the substrate mount comprises a rotateable mount for a wafer substrate and the target mount comprises sputtering apparatus.

31. The apparatus for vacuum coating deposition of thin film coatings in accordance with claim 30 wherein the rotateable mount for a wafer substrate is rigidly mounted to a first member of the superstructure extending through the chamber wall with a first vacuum seal at a first location, and the sputtering apparatus is rigidly mounted to a second member of the superstructure extending through the wall of the vacuum coating deposition chamber with a second vacuum seal at a second location.

32. The apparatus for vacuum coating deposition of thin film coatings in accordance with claim 29 Wherein the vacuum seal comprises flexible sheet steel having a radially inward portion secured in a vacuum-tight manner to a member of the superstructure proximate the chamber wall and having a radially outer portion secured in a vacuum-tight manner to the chamber wall.

33. Sputter deposition apparatus comprising:

a vacuum-tight deposition chamber having a chamber wall;

vacuum coating deposition components disposed within the deposition chamber, including at least a substrate mount to hold a substrate with a working surface exposed in the chamber and a coating material source apparatus comprising a target mount to hold a coating material target in the deposition chamber for PVD coating of a working surface of a substrate exposed in the chamber, a monitor for continual monitoring of at least one parameter of a coating deposition operation in the deposition chamber and for generating a corresponding control signal;

controller responsive to the control signal for continual control of at least one process variable of a coating deposition operation in the deposition chamber; and a superstructure structurally isolated from the deposition chamber, the substrate mount and the target mount each being rigidly mounted to the superstructure in fixed position relative to each other.

34. The sputter deposition apparatus of claim 33 wherein the monitor for continual monitoring of at least one parameter of a coating deposition operation is for monitoring actual or optical thickness of a film at a first radius $R_1$ greater than or equal to zero distance units from the center of a substrate and at a second radius $R_2$ greater than $R_1$.

35. The sputter deposition apparatus of claim 33 wherein the monitor for continual monitoring of at least one parameter of a coating deposition operation is for monitoring actual or optical thickness of a film at the center of a substrate and at a distance R greater than zero from the center of a substrate.

36. The sputter deposition apparatus of claim 33 wherein the monitor for continual monitoring of at least one parameter of a coating deposition operation is for monitoring distance between a working surface of a sputtering target and a working surface of a substrate during deposition of a film.

37. The sputter deposition apparatus of claim 33 wherein the monitor for continual monitoring of at least one parameter of a coating deposition operation is for monitoring distance between a working surface of a sputtering target and magnets of a magnetron sputtering cathode during deposition of a film.

38. The sputter deposition apparatus of claim 33 wherein the monitor for continual monitoring of at least one parameter of a coating deposition operation is for monitoring temperature of a sputtering target during deposition of a film.

39. The sputter deposition apparatus of claim 33 wherein the monitor for continual monitoring of at least one parameter of a coating deposition operation is for monitoring temperature of magnets of a magnetron sputtering cathode during deposition of a film.

40. The sputter deposition apparatus of claim 33 wherein the controller responsive to the control signal for continual control of at least one process variable of a coating deposition operation is for continual control of the position of a working surface of a sputtering target and the working surface of a substrate relative each other.

41. The sputter deposition apparatus of claim 40 wherein the controller for continual control of the position of a working surface of a sputtering target and the working surface of a substrate relative each other is for controlling distance between them.

42. The sputter deposition apparatus of claim 40 wherein the controller for continual control is for controlling orientation of a working surface of a sputtering target mounted in the target mount relative to a working surface of a substrate mounted in the target mount.

43. The sputter deposition apparatus of claim 33 wherein the coating material source apparatus comprises a magnetron sputtering cathode and the controller responsive to the control signal for continual control of at least one process variable of a coating deposition operation is for continual control of the position of a target working surface of a sputtering target mounted in the target mount and magnets of the magnetron sputtering cathode relative each other.

44. The sputter deposition apparatus of claim 43 wherein the controller for continual control of the position of a working surface of a sputtering target and magnets of the magnetron sputtering cathode relative each other is for controlling distance between them.

45. The sputter deposition apparatus of claim 43 wherein the controller for continual control is for controlling orientation of a working surface of a sputtering target mounted in the target mount relative to magnets of the magnetron sputtering cathode.

46. The sputter deposition apparatus of claim 33 wherein the controller responsive to the control signal for continual control of at least one process variable of a coating deposition operation adjusts the position of a working surface of a sputtering target mounted in the target mount.

47. The sputter deposition apparatus of claim 33 wherein the controller responsive to the control signal for continual control of at least one process variable of a coating deposition operation adjusts the position of a working surface of a substrate mounted in the substrate mount.

48. The sputter deposition apparatus of claim 33 wherein the coating material source apparatus comprises a magnetron sputtering cathode having magnets mounted behind the target mount, and the controller responsive to the control signal for continual control of at least one process variable of a coating deposition operation adjusts the position of the magnets.

49. The sputter deposition apparatus of claim 33 wherein the coating material source apparatus comprises a sputtering apparatus and the controller responsive to the control signal for continual control of at least one process variable of a coating deposition operation is for continual control of power to the sputtering apparatus.

50. The sputter deposition apparatus of claim 33 wherein the coating material source apparatus comprises a magnetron sputtering cathode and the controller responsive to the control signal for continual control of at least one process variable of a coating deposition operation is for continual control of the temperature of the magnets of the magnetron sputtering cathode.

51. The sputter deposition apparatus of claim 33 wherein the controller responsive to the control signal for continual control of at least one process variable of a coating deposition operation is for continual control of the temperature of a coating material mounted in the target mount.

52. The sputter deposition apparatus of claim 33 wherein the controller responsive to the control signal for continual control of at least one process variable of a coating deposition operation is a substrate temperature controller for continual control of the temperature of a substrate mounted in the substrate mount, wherein the substrate temperature controller is operative to maintain a substantially constant substrate temperature during at least a predetermined portion of the coating deposition operation, and wherein the substrate temperature controller is operative to deliver temperature control fluid to the substrate mount.

53. The sputter deposition apparatus of claim 33 wherein the controller responsive to the control signal for continual control of at least one process variable of a coating deposition operation is for controlling the process variable continuously during at least a portion of the deposition of a film.

54. The sputter deposition apparatus of claim 33 wherein the controller responsive to the control signal for continual control of at least one process variable of a coating deposition operation is for controlling the process variable periodically during at least a portion of the deposition of a film.

55. The sputter deposition apparatus of claim 33 wherein the controller responsive to the control signal for continual control of at least one process variable of a coating deposition operation is for controlling the process variable continuously during at least a portion of the deposition of a film.

56. The sputter deposition apparatus of claim 33 wherein the controller responsive to the control signal for continual control of at least one process variable of a coating deposition operation is for maintaining the process variable substantially constant.

57. The sputter deposition apparatus of claim 33 wherein the controller responsive to the control signal for continual control of at least one process variable of a coating deposition operation is for adjusting the process variable to control film deposition rate onto a substrate working surface.

58. Vacuum coating deposition apparatus comprising:
a vacuum-tight sputtering deposition chamber having a chamber wall;
an optical glass wafer substrate mounted in a substrate mount and having a substrate working surface exposed in the chamber for coating,
a sputtering target mounted in a target mount of a sputtering apparatus and having a target working surface in the chamber;
an optical monitor for continual monitoring of actual or optical film thickness at two locations on the substrate working surface during deposition of a film onto the substrate working surface and for generating a corresponding control signal; and
a controller for continual adjustment during at least a portion of a coating deposition operation in the deposition chamber to control the position of the target working surface relative to the substrate working surface.

59. The vacuum coating apparatus of claim 58 wherein the controller for continual adjustment of the position of the target working surface relative to the substrate working surface comprises a computer actuated automatic adjustment controller responsive to the control signal, for moving the sputtering target.

60. The vacuum coating apparatus of claim 58 further comprising a graphical user interface displaying the control signal, wherein the controller for continual adjustment of the position of the target working surface relative to the substrate working surface comprises an operator actuated adjustment controller for moving the sputtering target.

61. The vacuum coating apparatus of claim 58 further comprising at least one additional sputtering target mounted in a target mount of a sputtering apparatus and having a target working surface in the chamber.

62. Vacuum coating deposition apparatus comprising:
a vacuum-tight sputtering deposition chamber having a chamber wall;
an optical glass wafer substrate mounted in a substrate mount and having a substrate working surface exposed in the chamber for coating;
a sputtering target mount;
a sputtering target mounted by the target mount having a target working surface in the chamber;
an optical monitor for continual monitoring of actual or optical film thickness at two locations on the substrate working surface during deposition of a film onto the substrate working surface and for generating corresponding control signals, the target mount being operative to adjust the position of the target working surface relative to the substrate working surface in closed-loop response to the control signals received from the optical monitor corresponding to film thickness.

63. Vacuum coating deposition apparatus comprising:
a vacuum-tight sputtering deposition chamber having a chamber wall;
a substrate mounted in a substrate mount and having a working surface exposed in the chamber for coating;
a magnetron sputtering cathode having a target mount adapted to mount a sputtering target to present a sputtering target working surface in the chamber, and having a magnet assembly positioned behind the target mount to exert a confining force at the sputtering target working surface during operation of the vacuum coating deposition apparatus;
a monitor for continual monitoring of at least one parameter of a coating deposition operation in the deposition chamber and for generating a corresponding control signal; and
a controller for continual adjustment during at least a portion of a coating deposition operation in the deposition chamber to control the position of the target working surface relative to the magnet assembly.

64. The vacuum coating apparatus of claim 63 wherein the controller for continual adjustment of the position of the target working surface relative to the magnet assembly comprises a computer actuated automatic adjustment controller, responsive to the control signal, for moving the sputtering target.

65. The vacuum coating apparatus of claim 63 further comprising a graphical user interface displaying the control signal, wherein the controller for continual adjustment of the position of the target working surface relative to the magnet assembly comprises operator actuated adjustment controller for moving the sputtering target.

66. A method for vacuum deposition of thin film coatings onto a surface of a substrate, comprising:
providing a vacuum-tight deposition chamber having a chamber wall;
mounting vacuum coating deposition components within the deposition chamber to a superstructure structurally isolated from the deposition chamber, including at least a substrate mount holding a substrate with a substrate working surface exposed in the chamber and a coating material source apparatus comprising a target mount holding a coating material target in the deposition chamber, the substrate mount and the target mount each being rigidly mounted to the superstructure in fixed position relative to each other, and energizing the coating material source apparatus and coating the substrate working surface.

67. A method for vacuum deposition of thin film coatings onto a surface of a substrate, comprising:

provelling a vacuum-tight deposition chamber having a chamber wall;

mounting vacuum coating deposition components within the deposition chamber, including at least a substrate mount holding a substrate with a substrate working surface exposed in the chamber and a coating material source apparatus comprising a target mount holding a coating material target in the deposition chamber;

energizing the coating material source apparatus and commencing deposition of a coating onto the substrate working surface;

continually monitoring physical or optical film thickness uniformity of a film of a film stack of the coating and generating a corresponding control signal during at least a major portion of the deposition of a film of a film stack of the coating onto the substrate working surface; and continually controlling at least one process variable of the coating deposition in response to the control signal during at least a major portion of the deposition of a film of a film stack of the coating onto the substrate working surface.

68. The method for vacuum deposition of thin film coatings onto a surface of a substrate in accordance with claim 67 wherein the process variable is controlled continuously during deposition of a film of a film stack of the coating.

69. The method for vacuum deposition of thin film coatings onto a surface of a substrate in accordance with claim 67 wherein the process variable is adjusted prior to commencing deposition of a subsequent film of a film stack of the coating in response to a measured value for a preceding film of the film stack, and the process variable is subjected to continuous closed loop control during deposition of the subsequent film in response to closed-loop.

* * * * *